(12) United States Patent
Shimofuku et al.

(10) Patent No.: US 9,537,085 B2
(45) Date of Patent: *Jan. 3, 2017

(54) FABRICATION METHOD OF ELECTROMECHANICAL TRANSDUCER FILM, FABRICATION METHOD OF ELECTROMECHANICAL TRANSDUCER ELEMENT, ELECTROMECHANICAL TRANSDUCER ELEMENT, LIQUID EJECTION HEAD, AND IMAGE FORMING APPARATUS

(71) Applicant: RICOH COMPANY, LTD., Tokyo (JP)

(72) Inventors: Akira Shimofuku, Kanagawa (JP); Atsushi Takeuchi, Kanagawa (JP); Osamu Machida, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/827,902

(22) Filed: Aug. 17, 2015

(65) Prior Publication Data

US 2016/0049579 A1 Feb. 18, 2016

(30) Foreign Application Priority Data

Aug. 18, 2014 (JP) ................................ 2014-166098
Dec. 2, 2014 (JP) ................................ 2014-244078

(51) Int. Cl.
*B41J 2/00* (2006.01)
*H01L 41/332* (2013.01)
(Continued)

(52) U.S. Cl.
CPC .......... *H01L 41/332* (2013.01); *B41J 2/14233* (2013.01); *B41J 2/161* (2013.01);
(Continued)

(58) Field of Classification Search
None
See application file for complete search history.

(56) References Cited

U.S. PATENT DOCUMENTS

| 8,727,509 | B2* | 5/2014 | Shimofuku | ............... B41J 2/161 347/71 |
| 2005/0048208 | A1* | 3/2005 | Kao | ........................ G03F 7/162 427/345 |

(Continued)

FOREIGN PATENT DOCUMENTS

| JP | 2003-174211 | 6/2003 |
| JP | 2011-054716 | 3/2011 |

(Continued)

OTHER PUBLICATIONS

U.S. Appl. No. 14/689,138, filed Apr. 17, 2015.

*Primary Examiner* — Robert Vetere
(74) *Attorney, Agent, or Firm* — Cooper & Dunham LLP

(57) ABSTRACT

A method of fabricating an electromechanical transducer film includes applying a precursor solution on a support substrate, heating the substrate at a first temperature to form a ceramic thin-film in amorphous state, applying a sol-gel solution onto the ceramic thin-film, and heating the ceramic thin-film at a second temperature to form an electromechanical transducer thin-film in amorphous state. The method further includes heating the ceramic and transducer thin-films at a third temperature to thermally decompose an organic substance in the sol-gel solution and form a unitary thin-film, processing the unitary thin-film to form a patterned unitary thin-film, modifying an area on which the patterned film is not formed, discharging the sol-gel solution onto a surface of the patterned film by a liquid discharge head to apply the sol-gel solution to the surface of the (Continued)

patterned film, and heating the patterned film at a fourth temperature to crystallize the patterned film.

6 Claims, 19 Drawing Sheets

(51) Int. Cl.
  *B41J 2/14* (2006.01)
  *H01L 41/08* (2006.01)
  *H01L 41/25* (2013.01)
  *B41J 2/16* (2006.01)
(52) U.S. Cl.
  CPC .............. *B41J 2/164* (2013.01); *B41J 2/1629* (2013.01); *B41J 2/1645* (2013.01); *H01L 41/0805* (2013.01); *H01L 41/25* (2013.01)

(56) References Cited

U.S. PATENT DOCUMENTS

| | | |
|---|---|---|
| 2011/0175967 A1 | 7/2011 | Machida et al. |
| 2012/0026249 A1 | 2/2012 | Kihira et al. |
| 2012/0038712 A1* | 2/2012 | Akiyama .............. H01L 41/318 347/54 |
| 2012/0206544 A1 | 8/2012 | Machida et al. |
| 2012/0236084 A1 | 9/2012 | Watanabe et al. |
| 2013/0050346 A1 | 2/2013 | Takeuchi et al. |
| 2013/0070028 A1 | 3/2013 | Watanabe et al. |
| 2013/0162726 A1 | 6/2013 | Mizukami et al. |
| 2013/0164436 A1 | 6/2013 | Yagi et al. |
| 2013/0169713 A1 | 7/2013 | Takeuchi et al. |
| 2013/0176364 A1 | 7/2013 | Machida et al. |
| 2013/0194350 A1 | 8/2013 | Watanabe et al. |
| 2014/0049582 A1 | 2/2014 | Machida et al. |
| 2014/0340854 A1 | 11/2014 | Akiyama et al. |
| 2014/0375728 A1 | 12/2014 | Machida et al. |
| 2015/0145924 A1 | 5/2015 | Shimofuku et al. |

FOREIGN PATENT DOCUMENTS

| | | |
|---|---|---|
| JP | 2013-065670 | 4/2013 |
| JP | 2013-171962 | 9/2013 |

* cited by examiner

|  | EXAMPLE 1 | EXAMPLE 2 | COMPARATIVE EXAMPLE 2 |
|---|---|---|---|
| RELATIVE DIELECTRIC CONSTANT | 1380 | 1350 | 1020 |
| DIELECTRIC LOSS | 0.03 | 0.05 | 0.05 |
| PIEZOELECTRIC CONSTANT $d_{31}$ | 147 pm/V | 151 pm/V | 107 pm/V |

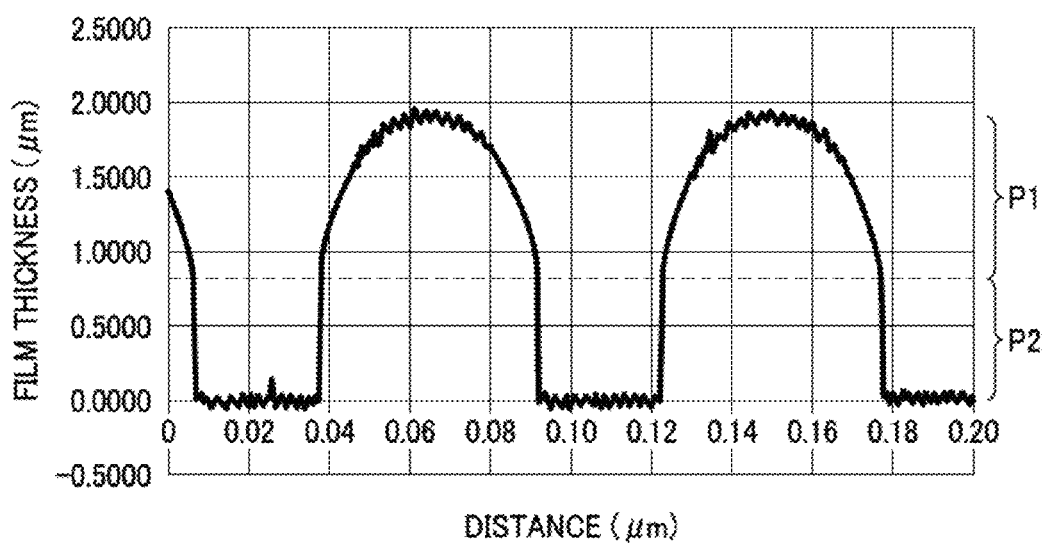

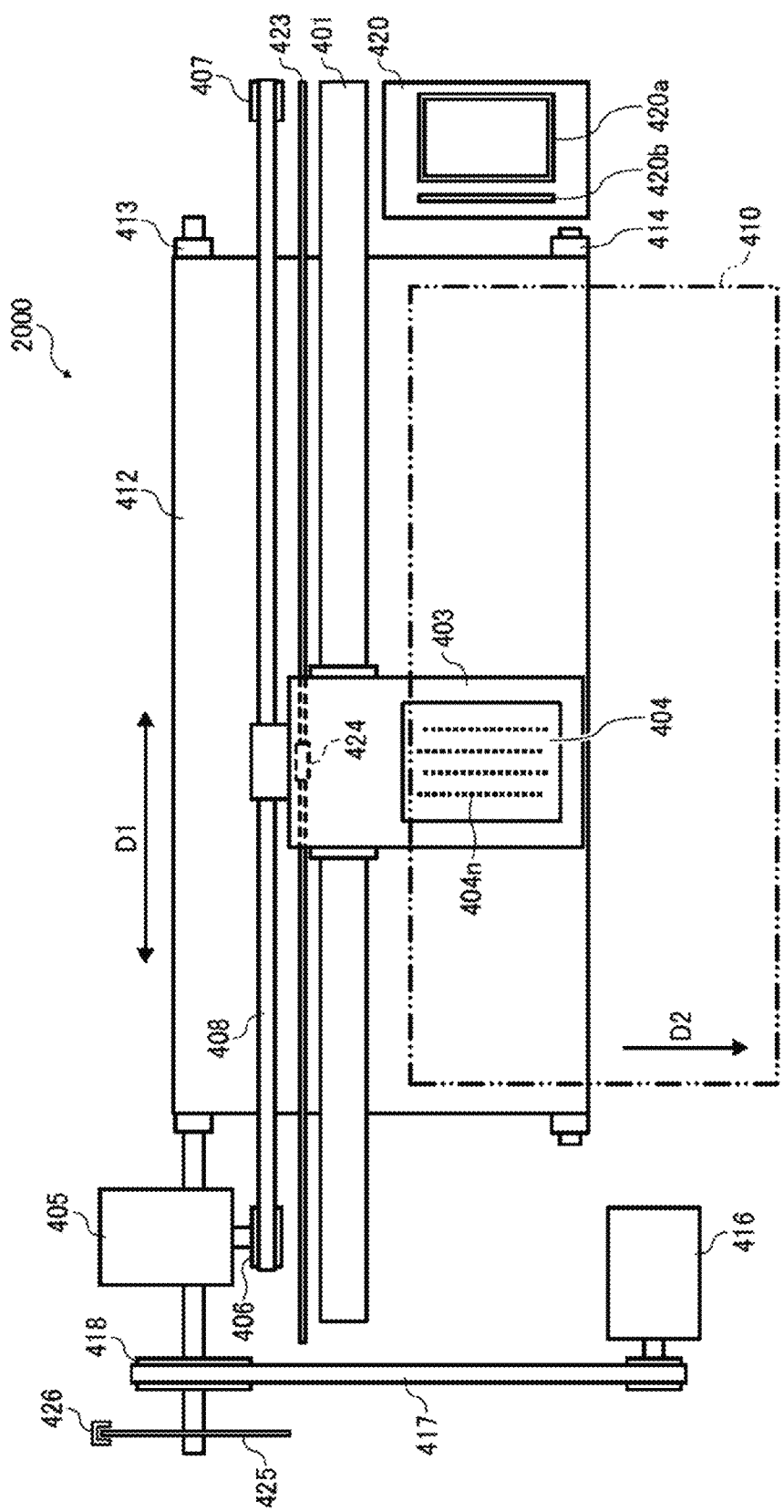

FABRICATION METHOD OF ELECTROMECHANICAL TRANSDUCER FILM, FABRICATION METHOD OF ELECTROMECHANICAL TRANSDUCER ELEMENT, ELECTROMECHANICAL TRANSDUCER ELEMENT, LIQUID EJECTION HEAD, AND IMAGE FORMING APPARATUS

CROSS-REFERENCE TO RELATED APPLICATIONS

This patent application is based on and claims priority pursuant to 35 U.S.C. §119(a) to Japanese Patent Application Nos. 2014-166098, filed on Aug. 18, 2014, and 2014-244078, filed on Dec. 2, 2014 in the Japan Patent Office, the entire disclosure of each of which is hereby incorporated by reference herein.

BACKGROUND

1. Technical Field

Embodiments of this disclosure relate to a fabrication method of an electromechanical transducer film, a fabrication method of an electromechanical transducer element, a liquid ejection head, and an image forming apparatus.

2. Description of the Related Art

A liquid discharge head may include a piezoelectric body serving as a pressure generator to pressurize liquid, e.g., ink in a liquid chamber and generate pressure. The piezoelectric body is, for example, a piezoelectric element (electromechanical transducer element) in which a lower electrode, a piezoelectric film serving as an electromechanical transducer film (layer), and an upper electrode are laminated one on another in this order.

SUMMARY

In an aspect of the present disclosure, there is provided a method of fabricating an electromechanical transducer film. The method includes applying a precursor solution of a ceramic thin film on a surface of a support substrate, heating and drying the support substrate at a first heating temperature lower than a crystallization temperature of the precursor solution to form the ceramic thin film in an amorphous state, applying a sol-gel solution of a precursor of the electromechanical transducer film onto the ceramic thin film, heating and drying the ceramic thin film and the sol-gel solution at a second heating temperature lower than a crystallization temperature of each of the ceramic thin film and the precursor solution to form an electromechanical transducer thin film in an amorphous state, heating the ceramic thin film and the electromechanical transducer thin film at a third heating temperature higher than each of the first heating temperature and the second heating temperature to thermally decompose an organic substance in the sol-gel solution and form a unitary thin film, processing the unitary thin film in a desired pattern to form a patterned unitary thin film, modifying an area of the surface of the support substrate on which the patterned unitary thin film is not formed, discharging the sol-gel solution onto a surface of the patterned unitary thin film by a liquid discharge head to apply the sol-gel solution to the surface of the patterned unitary thin film, and heating the patterned unitary thin film, on which the sol-gel solution is applied, at a fourth heating temperature higher than the third heating temperature to crystallize the patterned unitary thin film.

In an aspect of the present disclosure, there is provided a method of fabricating an electromechanical transducer element. The method includes forming the electromechanical transducer film on a first electrode by the above-described method and forming a second electrode on the electromechanical transducer film to form the electromechanical transducer element.

In an aspect of the present disclosure, there is provided a liquid discharge head including the electromechanical transducer film fabricated by the above-described method.

In an aspect of the present disclosure, there is provided an image forming apparatus including the liquid discharge head.

In an aspect of the present disclosure, there is provided an electromechanical transducer element including a first electrode, an electromechanical transducer film disposed on at least a portion of the first electrode, and a second electrode disposed on at least a portion of the electromechanical transducer film. The electromechanical transducer film has a cross-sectional shape in which a middle portion thereof protrudes further in a direction away from a surface of the first electrode than lateral ends thereof. The lateral ends has edge faces vertical to the surface of the first electrode.

In an aspect of the present disclosure, there is provided a method of fabricating the above-described electromechanical transducer element. The method includes applying a precursor solution of a ceramic thin film onto a surface of the first electrode, heating and drying the first electrode and the precursor solution at a heating temperature lower than a crystallization temperature of the precursor solution to form the ceramic thin film in an amorphous state, processing the ceramic thin film in a desired pattern to form a patterned thin film, modifying an area of the surface of the first electrode on which the patterned thin film is not formed, discharging the precursor solution of the ceramic thin film onto a surface of the patterned thin film by a liquid discharge head to apply the precursor solution to the surface of the patterned thin film, heating the patterned thin film and a coating film of the precursor solution formed on the patterned thin film to crystallize the patterned thin film and the coating film and form an electromechanical transducer film at a predetermined film thickness, and providing the second electrode on the electromechanical transducer film having the predetermined film thickness.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein:

FIG. 21 is a graph showing a cross-sectional shape of a patterned PZT film in a short direction of a patterned PZT film patterned PZT film serving as the electromechanical transducer film in the second embodiment;

FIG. 22 is a table showing an example of measurement results of dielectric breakdown voltage of the patterned PZT film of the electromechanical transducer film in the second embodiment along with measurement results of a comparative example;

FIG. 26 is a plan view of an example of an image forming apparatus according to an embodiment of this disclosure.

Figure 1A:
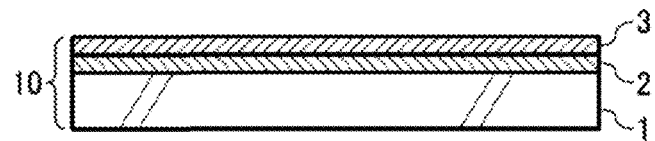
FIGS. 1A through 1D are illustrations of steps in a fabrication method of an electromechanical transducer film according to a first embodiment of this disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

For example, in this disclosure, the term "sheet" used herein is not limited to a sheet of paper and includes anything such as OHP (overhead projector) sheet, cloth sheet, glass sheet, or substrate on which ink or other liquid droplets can be attached. In other words, the term "sheet" is used as a generic term including a recording medium, a recorded medium, a recording sheet, and a recording sheet of paper. The terms "image formation", "recording", "printing", "image recording" and "image printing" are used herein as synonyms for one another. The terms "image formation", "recording", "printing", and "image printing" are used herein as synonyms for one another.

The term "image formation", which is used herein as a synonym for "recording" or "printing", includes providing not only meaningful images, such as characters and figures, but meaningless images, such as patterns, to the medium (in other words, the term "image formation" includes only causing liquid droplets to land on the medium).

The term "ink" is not limited to "ink" in a narrow sense, unless specified, but is used as a generic term for any types of liquid usable as targets of image formation, such as recording liquid and fixing solution.

The term "image" used herein is not limited to a two-dimensional image and includes, for example, an image applied to a three dimensional object and a three dimensional object itself formed as a three-dimensionally molded image.

The term "image forming apparatus" includes both serial-type image forming apparatus and line-type image forming apparatus.

Although the embodiments are described with technical limitations with reference to the attached drawings, such description is not intended to limit the scope of the disclosure and all of the components or elements described in the embodiments of this disclosure are not necessarily indispensable.

Hereinafter, embodiments of the present disclosure are described with reference to the attached drawings. First, a method of fabricating an electromechanical transducer film according to a first embodiment of the present disclosure is described with reference to FIGS. 1A through 1D, FIGS. 2A through 2D, and FIGS. 3A through 3D. FIGS. 1A through 1D, FIGS. 2A through 2D, and FIGS. 3A through 3D are schematic diagrams of the method of fabricating an electromechanical transducer film according to the first embodiment.

As a method of fabricating an electromechanical transducer film, an amorphous state of a patterned ceramic thin film is formed on a first electrode. The ceramic thin film is crystallization in a single layer state, and areas other than a pattern of a surface of the first electrode are modified into water repellency. Then, the step of forming a coating film of a precursor solution of the electromechanical transducer film by a liquid discharge head and the step of heat treatment are repeated to form the electromechanical transducer film at a desired film thickness.

However, for such a fabrication method, the film thickness of the patterned ceramic thin film crystallized is extremely thin. When the surface of the first electrode is modified, the first electrode is partially exposed within the pattern, which may hamper formation of the electromechanical transducer film with a desired quality.

According to at least one embodiment of the present disclosure, an electromechanical transducer film with a desired quality can be obtained as described below.

<Electrode Formation Process>

First, as illustrated in FIG. 1A, in an electrode forming step (support-substrate forming step), a base layer 2 is formed on a substrate 1 made of, e.g., silicon, and a first electrode 3 is formed on the base layer 2 to form a support substrate 10.

Note that the first electrode 3 acts as a lower electrode forming an electromechanical transducer element. Examples of a material of the first electrode may preferably include noble metals such as Au, Ag, and Pt, metals, such as Cu and Ni, and oxides of the noble metals and the metals. Note that the first electrode 3 constitutes of one or plural layers.

A method of forming the first electrode may, for example, be formed by general deposition such as sputtering.

<Ceramic Thin-Film Forming Step>

Figure 1B:
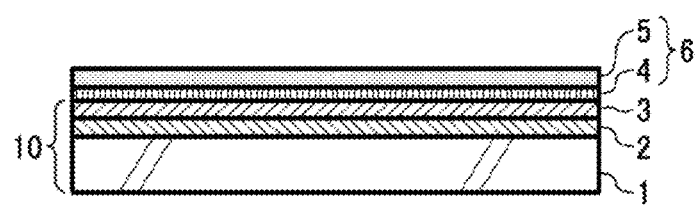

As illustrated in FIG. 1B, a precursor solution of a ceramic thin film is applied onto a surface of the first electrode 3 of the support substrate 10, and heated and dried at a first heating temperature which is lower than a crystallization temperature of the precursor solution, to form an amorphous ceramic thin film 4.

<Electromechanical Transducer Thin-Film Forming Step>

As illustrated in FIG. 1B, a sol-gel solution of a precursor of an electromechanical transducer film is applied onto the ceramic thin film 4, and heated and dried at a second heating temperature which is lower than a crystallization temperature of the solution of the precursor, to form an amorphous electromechanical transducer thin film 5.

Note that the second heating temperature may be the same as or difference from the first heating temperature. However, the second heating temperature is set to a temperature at which the amorphous ceramic thin film 4 is also not crystallized.

<Composite Thin-Film Forming Step>

The ceramic thin film 4 and the electromechanical transducer thin film 5 formed in the above-described thin film forming steps are heated at a third heating temperature which is higher than each of the first heating temperature and the second heating temperature, and organic substances in the sol-gel solution are thermally decomposed to form a unitary thin film 6.

In this embodiment, for the amorphous ceramic thin film 4 and the electromechanical transducer thin film 5 formed on the first electrode 3 in FIG. 1B, each coating film is formed by applying the precursor solution according to a chemical solution deposition (CSD) method. The CSD method facilitates a film formation process to the entire surface of the support substrate.

The solution application may be conducted by a general method, such as spin coating or spray coating, or a printing method employing a liquid discharge head (hereinafter also referred to as inkjet printing method). In such a case, spin coating is preferable to form a coating film on the entire surface of the support substrate and obtain a uniform film thickness of the coating film in the entire surface.

The functions of the amorphous ceramic thin film 4 are to obtain a good contrast of surface energy (liquid-repellency/lyophilic property) inside and outside a desired pattern area and good crystallinity and orientation of the electromechanical transducer film in the application of the sol-gel solution of the precursor to form electromechanical transducer film after the amorphous ceramic thin film 4 is patterned together with the amorphous electromechanical transducer thin film 5. A suitable composition is selected to achieve the functions.

For example, when the electromechanical transducer film is lead-zirconate-titanate PZT(53/47), lead titanate $PbTiO_3$ is selected as a preferable material of the ceramic thin film 4. A lead-titanate-rich PZT, for example, PZT(20/80) or PZT(40/60) is also preferable. Alternatively, PZT(53/47) may be used as in the electromechanical transducer film.

In other words, it is advantageous in the crystal formation of the electromechanical transducer film that a part or all of metal elements contained in the electromechanical transducer film formed on the ceramic thin film 4 is common to a metal element of the ceramic thin film 4.

For example, lead titanate is crystallized at a temperature which is lower than the crystallization temperature of PZT (53/47) by approximately 70° C. Accordingly, when sintered, lead titanate has a high crystallinity as the ceramic thin film 4 and serves as a so-called seed layer of the electromechanical transducer film. Crystallization data (e.g., lattice constant) of the ceramic thin film 4 is effective because the crystallinity is transferred to PZT(53/47) serving as the electromechanical transducer thin film 5 layered on the ceramic thin film 4.

Normally, in a step of forming an electromechanical transducer film according to a sol-gel method, the film thickness of the electromechanical transducer film formed in single application of a sol-gel solution and a heat treatment step is preferably 100 μm or less, and more preferably in a range of 50 nm or larger and 2 μm or less in any of a spin coating method and an inkjet printing method.

By contrast, the film thickness of the ceramic thin film 4 acting as the seed layer is preferably equal to or less than a film thickness of the electromechanical transducer film formed in the above-described single application and heat treatment step.

In other words, the ceramic thin film 4 having a film thickness of 100 μm or less can effectively suppress occurrence of cracks in the heat treatment step.

A lower limit of the film thickness of the ceramic thin film 4 is, further preferably, one tenth or less, more preferably in a range of one twentieth to one tenth of the film thickness of the electromechanical transducer film formed in the above-described single application and heat treatment step. For example, when the film thickness of the electromechanical transducer film formed in the above-described single application and heat treatment step is 50 nm, the film thickness of the ceramic thin film 4 is 5 nm or less, more preferably, in a range of 2.5 nm to 5 nm.

Setting the film thickness of the ceramic thin film 4 as described above facilitates the film thickness of the ceramic thin film 4 to be uniform in the spin coating application. Further, setting the film thickness of the ceramic thin film 4 as described above allows a uniform distribution of component elements in a film layered direction. Moreover, setting the film thickness of the ceramic thin film 4 as described above facilitates spread and movement of metal elements in an interface at which the ceramic thin film 4 joins the electromechanical transducer thin film 5 formed on the ceramic thin film 4.

Such a configuration can obtain a good-quality electromechanical transducer film having a high crystallinity without structural defects and secure continuity of crystal data.

Note that, when the rotation speed of a spindle in the spin coating application is uniform, the film thickness of the ceramic thin film 4 to be formed is proportional to the concentration of solid content in the precursor solution of the ceramic thin film. Accordingly, the film thickness of the ceramic thin film 4 can be easily controlled by adjusting the concentration of the solid content.

In a process of heating the coating film of the precursor solution of the ceramic thin film and forming the amorphous ceramic thin film 4, it is effective to limit the heat treatment to only the heating and drying at the first heating temperature, in other words, drying of solvent components.

In other words, as described above, the film thickness of the ceramic thin film 4 is equal to or less than the film thickness of the electromechanical transducer film formed in the above-described single application and heat treatment step.

For example, when the film thickness of the electromechanical transducer film formed in the above-described single application and heat treatment step is several tens nanometers, the ceramic thin film 4 has a film thickness of several nanometers.

In the heat treatment of the coating film of the precursor solution of the ceramic thin film 4, when solvent drying and thermal decomposition of organic substances are conducted on the ceramic thin film 4 having such a film thickness in order of nanometer, the ceramic thin film 4 instantly rises to a temperature of from approximately 350° C. to approximately 400° C.

At this time, the thermal decomposition of organic substances contained in a gelled coating film of the precursor solution of the ceramic thin film 4 may proceed with usage of oxygen contained in the coating film having a small film thickness.

Accordingly, when the electromechanical transducer film to be layered later is crystallized, the crystal includes oxygen loss and changes in orientation. Consequently, the continuity of the crystal structure cannot be secured in the electromechanical transducer film layered, and a desired crystal structure may not be obtained.

In addition, when the heat treatment is further advanced from the thermal decomposition to the crystallization of the ceramic thin film 4 in a single layer state, the temperature of the ceramic thin film 4 having a film thickness in order of nanometer instantly rises to approximately 700° C. to approximately 800° C.

In such a case, oxygen contained in the ceramic thin film 4 crystallized is wasted and, lead atoms in the ceramic thin film 4 diffuse into the base layer and are lost, causing so-called lead deficiency.

As described above, for the ceramic thin film 4 only, when an electromechanical transducer film is formed on the ceramic thin film 4 for crystallization, the crystal of the electromechanical transducer film would have a defective structure. For example, a non-oriented film is formed, and a desired crystal structure cannot be obtained. Additionally, a sufficient piezoelectric property of electromechanical transducer element cannot be obtained. In other words, the ceramic thin film having been subjected to the above-described heat treatment process does not act as a seed layer.

Hence, in this embodiment, subsequently to the ceramic thin film 4 subjected to solvent drying, the precursor sol-gel solution is applied to laminate a coating film on the ceramic thin film 4. As a heat treatment process to form the amorphous electromechanical transducer thin film 5, solvent drying is conducted at the second heating temperature at which the amorphous electromechanical transducer thin film 5 can be formed. Then, by heating the amorphous electromechanical transducer thin film 5 at a third heating temperature higher than the first heating temperature and the second heating temperature, thermal decomposition is conducted on the amorphous electromechanical transducer thin film 5 to unite the amorphous ceramic thin film 4 and the electromechanical transducer thin film 5 together, thus forming the unitary thin film 6.

As described above, the film thickness of the electromechanical transducer film formed in single application of the sol-gel solution and the heat treatment step is typically set to 100 μm or less, and more preferably in a range of 50 nm or larger and 2 μm or less in any of a spin coating method and an inkjet printing method.

Accordingly, the total thickness of the precursor sol-gel solution and the ceramic thin film 4 precedently formed can withstand oxygen loss even if oxygen in the films are used by thermal decomposition of organic substance conducted at a temperature of approximately 350° C. to approximately 400° C. and the ceramic thin film 4 is crystallized together with the coating film of the precursor sol-gel solution applied and layered by an inkjet printing method.

However, if the crystallization process is conducted with the electromechanical transducer thin film 5 formed in a single layer, as described above, lead volatilization would arise. In such a case, a non-oriented film having a defective crystal structure would be formed and not act as the seed layer.

As described above, for the amorphous unitary thin film 6, in which the ceramic thin film 4 and the electromechanical transducer thin film 5 are united together, it is necessary to conduct patterning in a downstream step, that is, an application step of the precursor sol-gel solution of the electromechanical transducer film according to an inkjet printing method, to obtain a contrast in surface energy.

<Patterning Step>

Figure 1C:
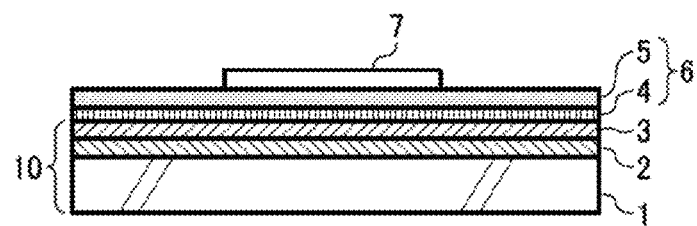
Figure 1D:
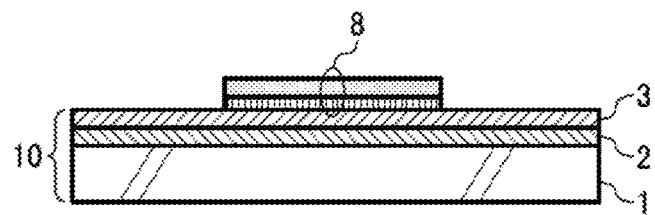

As illustrated in FIG. 1C, a photoresist layer 7 of a desired shape is formed on the amorphous unitary thin film 6. As illustrated in FIG. 1D, the unitary thin film 6 is patterned by etching to form a patterned unitary thin film 8.

The amorphous unitary thin film 6 is patterned in accordance with a desired electromechanical transducer film (element) to be formed. It is preferably to conduct patterning by photolithography and wet etching. Since the film thickness to be processed is quite small in order of several tens nanometers, such patterning is advantageous in that a pattern can be readily formed by selecting the composition of an etchant.

Examples of the etchant used for wet etching include hydrofluoric acid, nitric acid, acetic acid, and acid mixed with water. Note that water serves as diluent and acetic acid serves as buffer and surfactant. Using less-soluble ammonium fluoride instead of hydrofluoric acid can afford a larger margin in a wet etching process.

The unitary thin film 6 of the ceramic thin film 4 and the electromechanical transducer thin film 5 more readily dissolves in an amorphous state than in a crystal state.

In a case in which the electromechanical transducer thin film 5 is PZT, when lead zirconate ($PbZrO_3$) contained in PZT is in a crystal state, zirconium oxide ($ZrO_2$) is likely to be an etching residual. Accordingly, when lead zirconate is contained in the components of the seed layer, the amorphous state is preferable from viewpoints of the easiness of etching and the film properties (crystallinity and orientation) of the electromechanical transducer film after the above-described final crystallization.

Note that, as illustrated in FIG. 1D, when the patterned unitary thin film 8 of the patterned ceramic thin film 4 and electromechanical transducer thin film 5 remains in an amorphous state, the patterned unitary thin film 8 does not act as the seed layer.

Then, it is effective to crystallize the patterned unitary thin film 8 together with a coating film formed by applying a precursor sol-gel solution of an electromechanical transducer film applied according to an inkjet printing method in a downstream step. Below, a step subsequent to the patterning step is described with reference to FIGS. 2A through 2D.

<Modifying Step>

Figure 2A:
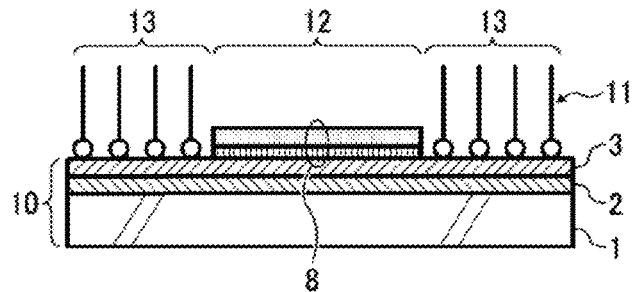
FIGS. 2A through 2D are illustrations of steps subsequent to the steps of FIGS. 1A through 1D.

As illustrated in FIG. 2A, the support substrate 10 including the first electrode 3 and the patterned unitary thin film 8 is dipped into alkanethiol liquid, and a surface modifying process is conducted on an area of a surface of the support substrate 10 in which the patterned unitary thin film 8 is not formed.

Thus, as illustrated in FIG. 2A, a self-assemble monolayer (SAM) film 11 is formed on a surface of the first electrode 3 exposed in an area other than the patterned unitary thin film 8 on the support substrate 10.

In this case, the alkanethiol to be used is not particularly specified. However, it may, for example, be preferable that alkanethiol include molecules having a carbon chain length of C6 to C18. Further, it is preferable that a solution obtained by dissolving alkanethiol into a general organic solvent such as alcohol, acetone, or toluene be used as a SAM material, that is, a surface modifying liquid.

The SAM film has properties of being readily formed on, for example, noble metals, such as Au, Ag, and Pt, metals, such as Cu and Ni, and oxides thereof. An area on which the SAM film is formed has liquid-repellency. On the other hand, the SAM film is not formed on ceramics, such as PZT, and other metal oxides than the above-described noble metals. Such an area on which the SAM film is not formed is not liquid-repellency, and is maintained to be lyophilic.

In other words, according to this embodiment, by dipping the support substrate 10 into the alkanethiol liquid, a surface of the patterned unitary thin film 8 in amorphous state is formed into a lyophilic area 12, and only a surface of the other portion in which the first electrode 3 is exposed is formed into a liquid-repellent area 13, thus simply conducting surface modification.

<Application Step>

Figure 2B:
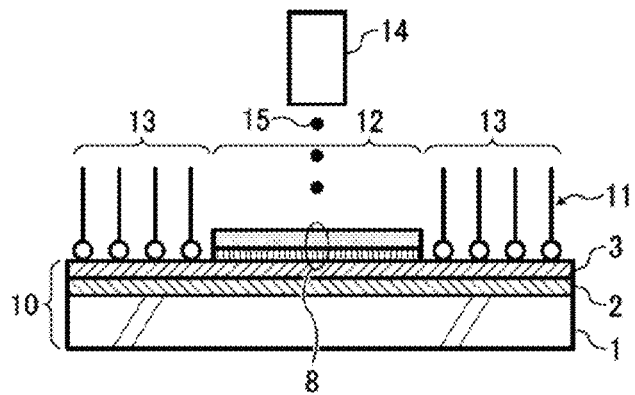
Figure 2C:
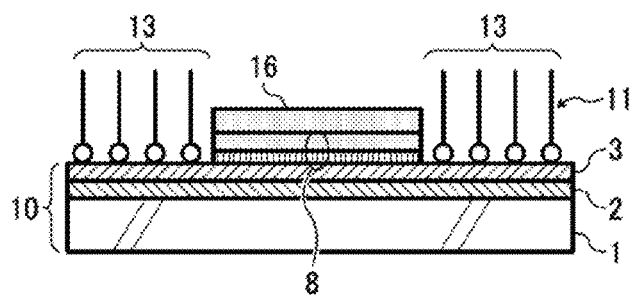

Next, as illustrated in FIG. 2B, a precursor sol-gel liquid 15 of an electromechanical transducer film is applied onto the surface of the patterned unitary thin film 8 according to an inkjet printing method using a liquid discharge head 14. As illustrated in FIG. 2C, a coating film 16 of the sol-gel liquid is formed on the patterned unitary thin film 8 being a desired pattern.

Here, as described above, an area applied with a sol-gel liquid, that is, the patterned unitary thin film 8 is lyophilic. By contrast, an area of the first electrode 3 to which the sol-gel liquid is not applied, that is, a surface of the first electrode 3 in an area excluding the patterned unitary thin film 8, is liquid-repellent as a SAM film 11 is formed on the area by the surface modification.

Thus, since wettability (applicability) is different inside and outside the area of the patterned unitary thin film 8 in which the desired electromechanical transducer film is formed, it is possible to apply the sol-gel liquid to one portion and the other portion separately with high accuracy. Accordingly, as described below, it is possible to directly form the electromechanical transducer liquid film having a desired shape.

At this time, the film thickness of the patterned unitary thin film 8 is secured to be 50 nm or greater as described above, thus obtaining a clear contrast of lyophilic and liquid-repellent properties on pattern edge lines.

In other words, when a precursor solution is applied onto the patterned unitary thin film 8 by inkjet printing, the spread of the coating film remains within the patterned unitary thin film 8, thus obtaining a desired pattern of the electromechanical transducer film.

Figure 4:
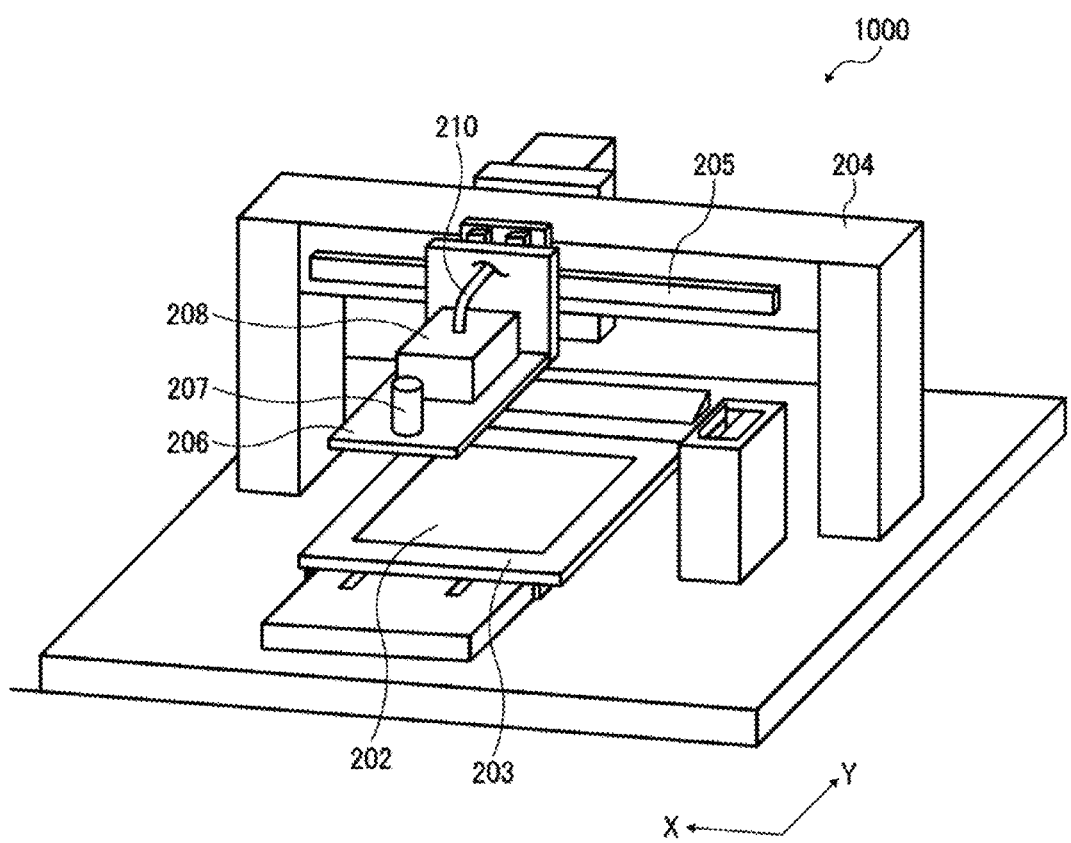
FIG. 4 is a perspective view of an industrial inkjet apparatus.

Hence, separate application of the sol-gel solution between areas according to the inkjet printing method can be preferably used for an industrial inkjet apparatus 1000 as illustrated in FIG. 4.

Here, an example of an industrial inkjet apparatus is described with reference to FIG. 4. FIG. 4 is a perspective view of an industrial inkjet apparatus 1000 serving as an image forming apparatus according to this embodiment.

The industrial inkjet apparatus 1000 includes a stage 203 configured to drive a substrate 202 on the stage 203 in a direction indicated by arrow Y. The industrial inkjet apparatus 1000 further includes a head base 206 having a liquid discharge head 208 and an imaging apparatus 207 such that the head base 206 faces the substrate 202 on the stage 203.

The liquid discharge head 208 is connected to a functional-material supply pipe 210, and configured to receive an application liquid, such as a sol-gel liquid, from a tank and supply the application liquid to the substrate 202.

The imaging apparatus 207 is configured to image any part formed on the substrate 202, and may, for example, be connected to an external computer or the like to detect an alignment mark formed on the substrate 202.

The head base 206 includes an X-axis drive device 205 disposed on an X-axis supporting member 204 so as to move the head base 206 in a direction indicated by arrow X. Accordingly, landing positions of droplets of the application liquid supplied from the liquid discharge head 208 on the substrate 202 may be changed by the stage 203 and the X-axis drive device 205.

Here, the sol-gel liquid discharged from the liquid discharge head is described below.

A configuration of the sol-gel liquid applied to a desired patterned unitary thin film 8 is not particularly specified, and any configuration may be selected based on the electromechanical transducer film to be formed.

In a case of the electromechanical transducer film used as a thin film actuator, it is preferable that the electromechanical transducer film be formed of a composite metal oxide film. Specifically, in a case where the electromechanical transducer film is PZT (lead-zirconate-titanate), lead acetate, zirconium alkoxide, and titanium alkoxide that are used as starting materials are dissolved in 2-methoxyethanol that is used as a common solvent, to obtain a uniform PZT so-gel liquid.

PZT is a solid solution of lead zirconate ($PbZrO_3$) and lead titanate ($PbTiO_3$), and is represented by the following chemical formula $Pb(Zr_{1-x}Ti_x)O_3$ (0<x<1). However, a characteristic varies according to the ratio. In general, the composition indicating superior electromechanical properties has a molar ratio of $PbZrO_3$ to $PbTiO_3$ at 53:47, which is represented by the following chemical formula: $Pb(Zr_{0.53}Ti_{0.47})O_3$, and is generally represented by PZT(53/47). Hence, it is preferable that the starting materials of the lead acetate, zirconium alkoxide, titanium alkoxide be measured and mixed to obtain the stoichiometric mixture ratio of the above chemical formula.

Note that the coating film 16 may be heated in a heat treatment step, described below, so as to serve as an electromechanical transducer film 17. Specifically, crystallization in the heat treatment step may cause partial volatilization of Pb atoms in the coating film 16. That is, the crystallization in the heat treatment step may cause so-called "lead volatilization".

Hence, it is preferable that the lead volatilization in the heat treatment step be assumed to prepare a composite oxide containing lead such as PZT, and an excessive amount of Pb at mass ratio of approximately 5% to approximately 25% compared to the stoichiometry be added to the starting materials.

Further, the metal alkoxide compound is hydrolyzed by atmospheric water easily. Hence, it is preferable to add appropriate amounts of acetylacetone, acetic acid, diethanolamine, and the like as stabilizers to suppress the progress of hydrolysis.

A preferable example of a material for use in the electromechanical transducer film includes barium titanate and the like. When barium titanate is used, barium alkoxide and titanium alkoxide may be used as the starting materials, and these compounds may be dissolved into a common solvent to prepare a sol-gel liquid for barium titanate.

Note that it is preferable that the quality of the sol-gel liquid such as the viscosity and the surface tension be adjusted in order to facilitate the supply of the so-gel liquid from the liquid discharge head.

As described above, the application of the sol-gel solution according to the inkjet printing method may be conducted by an industrial inkjet apparatus as illustrated in FIG. 4.

At this time, the above-described alignment mark formed in the patterning by photolithography and wet etching or a real pattern of an area in which the electromechanical transducer film is formed can be used to detect the application position of the sol-gel liquid with high accuracy.

<Crystallization Step>

Figure 2D:
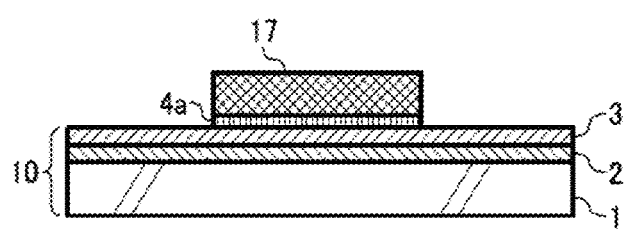

As illustrated in FIG. 2D, heat treatment is conducted on the coating film 16 of the precursor sol-gel solution of the electromechanical transducer film that is formed by the inkjet printing method. After formation of the coating film 16 of the sol-gel solution supplied by the inkjet printing method, a heat treatment step to heat the coating film 16 is conducted to form an electromechanical transducer film 17.

A specific content of the heat treatment is not particularly specified. However, the heat treatment step may include a drying step to heat the so-gel liquid at the second heating temperature to dry the so-gel liquid, and a thermal decomposition step to heat the sol-gel liquid at the third heating temperature higher than the second heating temperature to thermally decompose an organic substance or the like contained in the sol-gel liquid.

However, in this embodiment, the heat treatment step includes a crystallization step to heat the sol-gel liquid at a fourth heating temperature higher than the third heating temperature to crystallize substances constituting the electromechanical transducer film 17.

A specific requirement of the heat treatment is not particularly specified because the requirement may differ with a type of the sol-gel liquid to be employed.

For this embodiment, it is effective to crystallize the above-described patterned unitary thin film 8 in amorphous state together with the coating film 16 of the sol-gel liquid applied on the patterned unitary thin film 8 by the inkjet method.

As described above, metal elements contained in the precursor solution of the ceramic thin film 4 and the electromechanical transducer thin film 5 are common to metal elements used in the above-described coating film 16 of the sol-gel solution. Metal atoms and oxygen atoms to be used are complemented in an interface between the patterned unitary thin film 8 and the electromechanical transducer film 17.

As described above, after the application of the sol-gel liquid, drying, and thermal decomposition, the crystallization process is conducted on the patterned unitary thin film 8 together with the coating film 16 in a state in which the gelled coating film 16 is laminated on the patterned unitary thin film 8. Thus, the patterned unitary thin film 8 can be formed as an electromechanical transducer film having a high orientation rate and a desired crystal characteristic without structural defects. At this time, the ceramic thin film 4 is crystallized and formed into the ceramic thin film 4.

Thus, the patterned unitary thin film 8 including the ceramic thin film 4 and the electromechanical transducer thin film 5 can act as the seed layer.

Note that the timing of crystallization of the ceramic thin film 4 is not particularly specified. For example, the crystallization step may be conducted after a first layer of the sol-gel liquid is applied by the inkjet printing method, dried, and thermally decomposed. As described above, the film thickness of the electromechanical transducer film 17 formed by the inkjet printing method is 50 nm at minimum. A total film thickness of the electromechanical transducer film 17 and the ceramic thin film 4 and the electromechanical transducer thin film 5 laminated in the preceding step is secured to be 100 nm or greater.

Such a configuration provides a film capable of withstanding diffusion of metal atoms contained in the above-described ceramic thin film 4, in particular, lead atoms into the first electrode 3, thus allowing formation of a desired electromechanical transducer film. Note that the crystallization step may be conducted after the application, drying, and thermal decomposition of the sol-gel liquid are repeated plural times.

Figure 3A:
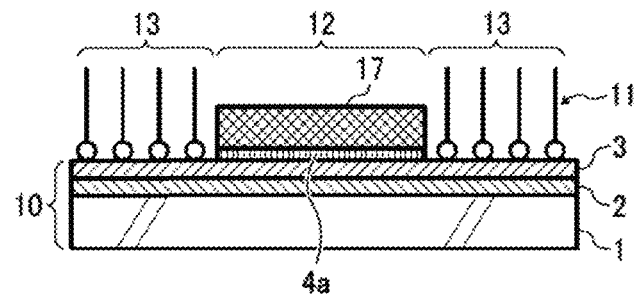
FIGS. 3A through 3D are illustrations of steps subsequent to the steps of FIGS. 2A through 2D.
Figure 3B:
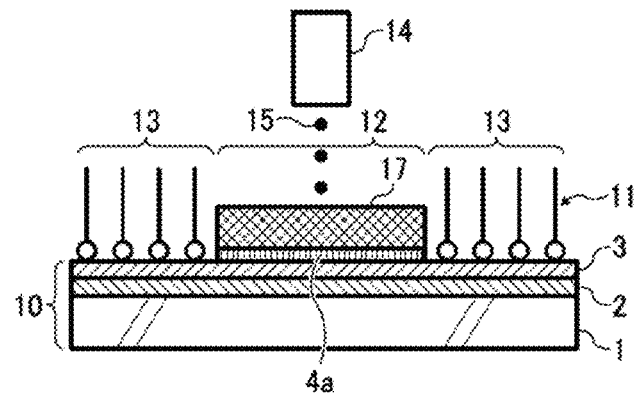
Figure 3C:
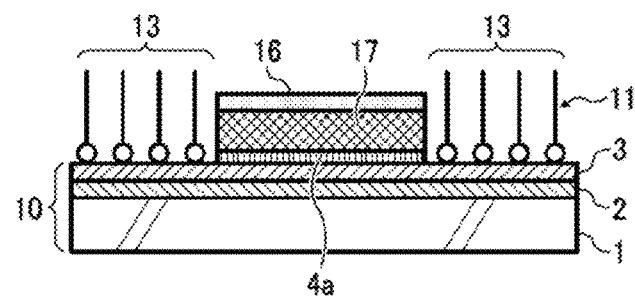
Figure 3D:
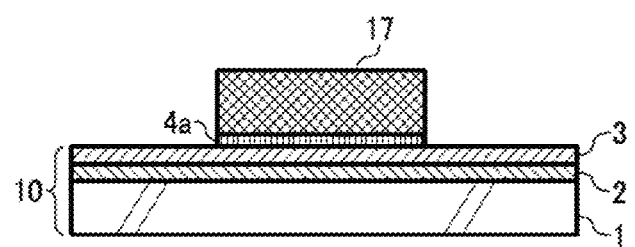

As illustrated in FIGS. 3A through 3D, a similar process is repeated on the electromechanical transducer film 17 formed through the above-described process to obtain an increased thickness of the electromechanical transducer film 17 as illustrated in FIG. 3D.

In other words, when the electromechanical transducer film forming step is conducted two or more times, by utilizing a feature in which the SAM film 11 is not formed on the electromechanical transducer film 17, the support substrate 10 is dipped into alkanethiol solution after the first time of the electromechanical transducer liquid film forming step by the inkjet printing method is completed.

Thus, as illustrated in FIG. 3A, only a portion other than the pattern of the electromechanical transducer film 17 on the support substrate 10, that is, an exposed portion of the first electrode 3 partially becomes liquid-repellent.

Then, as illustrated in FIG. 3B, the precursor sol-gel liquid is applied within a desired pattern to form a coating film 16 as illustrated in FIG. 3C. Then, through a similar heat treatment step, the electromechanical transducer film 17 having an increased thickness as illustrated in FIG. 3D is formed.

Thus, the thickness of the electromechanical transducer film 17 can be consecutively increased using the same apparatus and the same process.

Further, the electromechanical transducer element can be formed by forming the second electrode (i.e., the upper electrode) on the electromechanical transducer film 17 obtained by the fabrication method of the electromechanical transducer film according to the above-described embodiment.

The material and the film thickness of the second electrode are not particularly specified. For example, the second electrode may have a configuration similar to that of the first electrode, and may be formed on the upper surface of the electromechanical transducer film 17. Note that the second electrode may be a discrete electrode. Hence, the second electrode may optionally be etched so as to pattern an individual electrode.

For the electromechanical transducer element according to this embodiment, the electromechanical transducer film has a desired, precise, and appropriate shape and retains a desired film-layer orientation and a high crystallinity. Thus, the electromechanical element is capable of exhibiting high electromechanical transduction performance.

Figure 5:
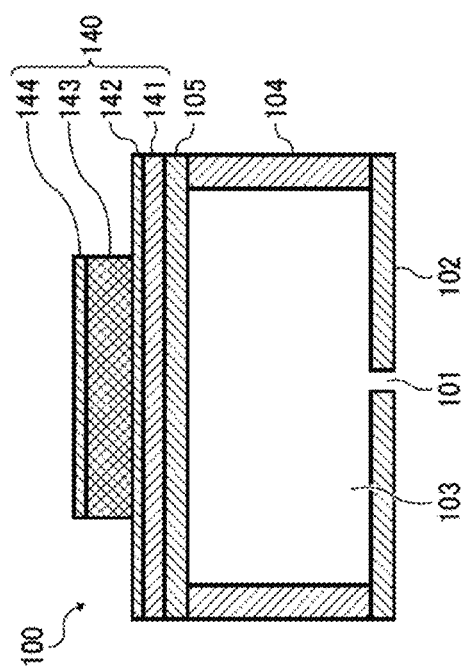
FIG. 5 is a schematic cross-sectional view of a first example of a liquid discharge head according an embodiment of this disclosure.

Next, a first example of a liquid discharge head according to an embodiment of this disclosure is described with reference to FIG. 5. FIG. 5 is a schematic cross-sectional view of a liquid discharge head according to this embodiment.

The liquid discharge head 100 includes a nozzle substrate 102 including nozzles 101 through which to discharge droplets, a channel substrate 104 to form channels (pressure chambers) 103 communicated with the nozzles 101, and a diaphragm 105 forming walls of the pressure chambers 103.

Piezoelectric actuators made of electromechanical transducer elements 140 according to this embodiment are disposed on a face of the diaphragm 105 opposite the pressure chambers 103.

The electromechanical transducer elements 140 includes an oxide electrode 141, a platinum group electrode 142 serving as a first electrode (lower electrode), an electromechanical transducer film 143, a second electrode (upper electrode) 144 that are laminated in this order on the diaphragm 105. The electromechanical transducer elements 140 is formed by a method of fabricating an electromechanical transducer element according to the first embodiment of the present disclosure.

For the liquid discharge head 100, by applying a voltage between the upper electrode 144 and the lower electrode 142, the electromechanical transducer film 143 extends in an electrode lamination direction, in other words, an electric-field direction and contracts in a direction parallel to the diaphragm 105.

At this time, since the lower electrode 142 is restricted by the diaphragm 105, a tensile stress arises at a side of the diaphragm 105 facing the lower electrode 142 and the diaphragm 105 bends toward the pressure chamber 103 and pressurizes internal liquid, thus discharging droplets from the nozzles 101.

As described above, use of piezoelectric actuators made of electromechanical transducer elements made by a method of fabricating an electromechanical transducer element according to an embodiment of the present disclosure allows stable droplet discharge.

Figure 6:
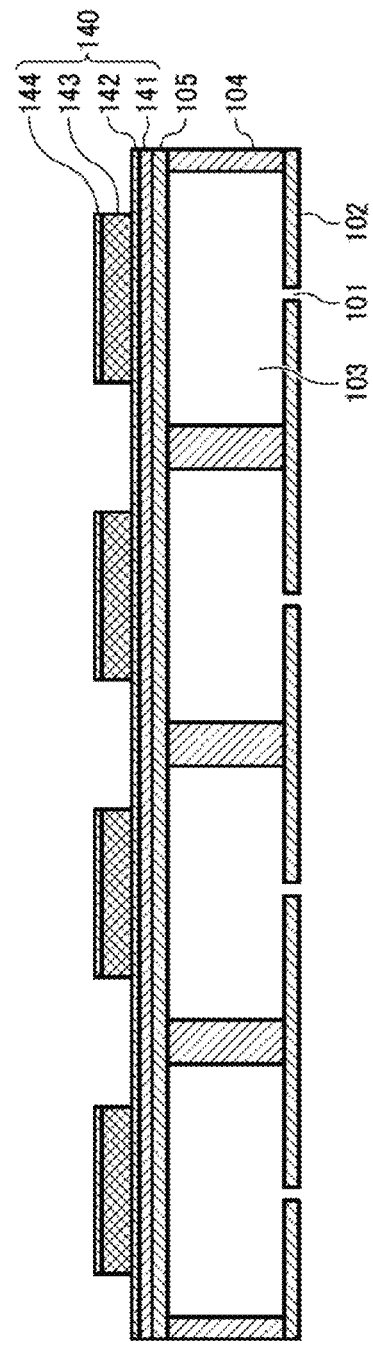
FIG. 6 is a schematic cross-sectional view of a second example of a liquid discharge head according an embodiment of this disclosure.

Next, a second example of a liquid discharge head according to an embodiment of this disclosure is described with reference to FIG. 6. FIG. 6 is a schematic cross-sectional view of a liquid discharge head 100 according to this embodiment.

The liquid discharge head 100 includes four electromechanical transducer elements 140 sharing a diaphragm 105 and a lower electrode 142 and has a structure of four nozzle rows in which the nozzles 101 are arrayed in four rows. The configuration of a portion corresponding to each nozzle 101 is similar to, if not the same as, that illustrated in FIG. 5, and descriptions thereof are omitted.

Next, examples are illustrated.

Example 1

Steps of Example 1 are described with reference to FIGS. 7A through 7D, FIGS. 8A through 8D, and FIGS. 9A through 9D. FIGS. 7A through 7D, FIGS. 8A through 8D, and FIGS. 9A through 9D are schematic diagrams of a fabrication method of Example 1.

Figure 7A:
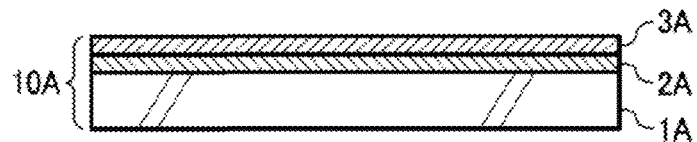
FIGS. 7A through 7D are illustrations of steps in a fabrication method of Example 1.

As illustrated in FIG. 7A, a $TiO_2$ layer 2A serving as a base layer and a platinum (Pt) layer 3A serving as a first electrode highly reactive to thiol are laminated in turn on a face of a silicon substrate 1A by sputtering to form a support substrate 10A.

At this time, the film thickness of the $TiO_2$ layer (base layer) 2A was 50 nm, and the film thickness of the Pt layer (first electrode) 3A was 250 nm.

Figure 7B:
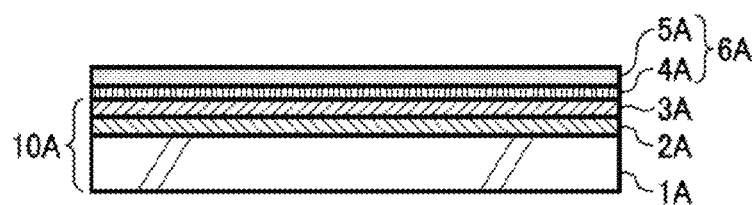

Next, as illustrated in FIG. 7B, precursor solution of a lead titanate thin film 4A was applied onto an entire surface of the Pt layer 3A of the support substrate 10A by spin coating.

The precursor solution applied included lead acetate trihydrate and titanium isopropoxide as starting materials. Crystal water of the lead acetate was dissolved in methoxyethanol, and was then dehydrated. Then, titanium isopropoxide was dissolved in methoxyethanol to promote an alcohol exchange reaction and an esterification reaction, and the obtained product was mixed with the lead acetate dissolved methoxyethanol to obtain a precursor solution of lead titanate (PT). The concentration of the solid content of the precursor solution was 0.03 mol/l.

For the precursor solution coating film formed on the support substrate 10A, the support substrate 10A was heated from a bottom face at 120° C. (first heating temperature) by a hot plate to dry a solvent component, thus forming an amorphous state of the lead titanate thin film 4A at a film thickness of 5 nm.

Subsequently, a sol-gel solution of an electromechanical transducer film precursor was applied onto an entire surface of the amorphous state of the lead titanate thin film 4A by spin coating.

The sol-gel liquid used here included lead acetate trihydrate, titanium isopropoxide, and zirconium isopropoxide as starting materials. Crystal water of the lead acetate was dissolved in methoxyethanol, and was then dehydrated. Titanium isopropoxide and zirconium isopropoxide were dissolved in methoxyethanol to promote an alcohol exchange reaction and an esterification reaction, and the obtained product was mixed with the lead acetate dissolved methoxyethanol to obtain a sol-gel liquid of lead zirconate titanate (PZT). The concentration of the solid content of the sol-gel liquid was 0.3 mol/l.

Note that in preparing the sol-gel liquid, the amount of lead acetate added was adjusted such that the amount of lead was made surplus by 10 mol % to the stoichiometry. The amount of lead acetate added was adjusted as above in order to prevent the degradation of crystallinity due to lead deficiency during the heat treatment.

For the coating film of the sol-gel solution of the electromechanical transducer film precursor formed on the support substrate 10A, the support substrate 10A was heated from the bottom face at 120° C. (second heating temperature), which was the same as the first heating temperature, by the hot plate to dry a solvent component.

Subsequently, the support substrate 10 was heated from the bottom face at 450° C. (third heating temperature) by the hot plate to thermally decompose organic substance contained in the gelled coating film.

Thus, a unitary thin film 6 having a film thickness of 65 nm was formed including the amorphous state of the lead titanate thin film 4A already formed. In other words, an amorphous state of a lead-zirconate-titanate thin film 5A having a film thickness of 60 nm was formed on the amorphous state of the lead titanate thin film 4A to form a PT-PZT unitary thin film 6A.

Comparative Example 1

In Comparative Example 1, only the formation of the amorphous state of the lead titanate thin film 4A was conducted without conducting the formation of the amorphous state of the lead-zirconate-titanate thin film 5A conducted in Example 1.

Figure 7C:
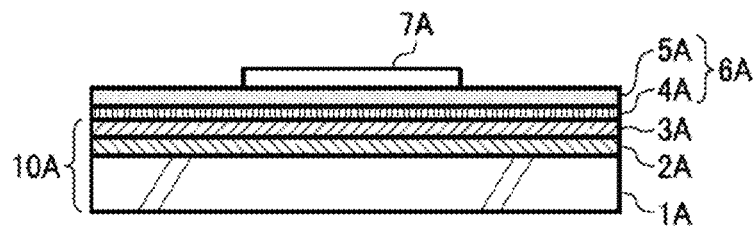

Returning to Example 1, as illustrated in FIG. 7C, a photoresist layer 7A was formed on the amorphous state of the PT-PZT unitary thin film 6A in accordance with a pattern of a desired electromechanical transducer film (having a width of 50 μm and a length of 100 μm and arranged in plural rows) by a photolithographic process.

The PT-PZT unitary thin film 6A exposed to the photoresist layer 7A was wet-etched. Etchant was a mixture containing hydrofluoric acid (50%), nitric acid (60%), acetic acid, and pure water in a volume ratio of 1:3:8:8. The PT-PZT unitary thin film 6A was etched at room temperature, and then the photoresist layer 7A was removed by organic solvent.

Figure 7D:
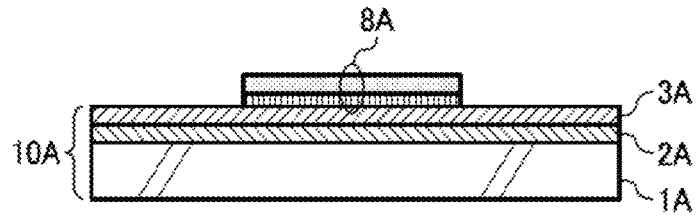

Thus, as illustrated in FIG. 7D, an amorphous state of a patterned PT-PZT unitary thin film 8 having the same shape as the pattern of the desired electromechanical transducer film was formed.

Figure 8A:
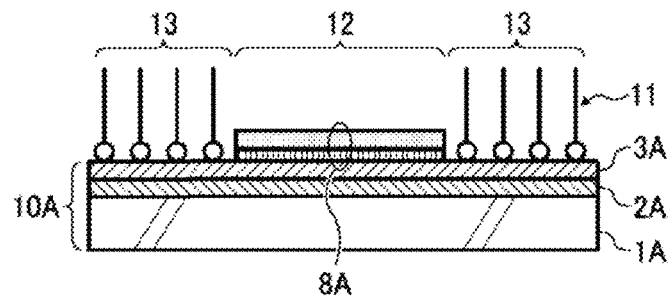
FIGS. 8A through 8D are illustrations of steps subsequent to the steps of FIGS. 7A through 7D.

Next, a surface modifying step was conducted as illustrated in FIG. 8A. In other words, liquid-repellent treatment was conducted by forming a SAM film 11 on the Pt layer 3A. The SAM film 11 was obtained by immersing the support substrate 10 including the patterned PT-PZT unitary thin film 8 in the alkanethiol solution serving as a liquid-repellent treatment liquid for several seconds to allow molecules to be arranged by themselves.

In the liquid-repellent treatment liquid, dodecanethiol CH3(CH2)11-SH served as alkanethiol, and dehydrated ethanol served as a solvent, and the solution concentration was 0.1 m mol/l.

After the support substrate 10A was immersed in the alkanethiol solution, the entire surface of the support substrate 10A was washed with ethanol, and then further washed with pure water. Subsequently, the washed support substrate 10A was dried under a nitrogen atmosphere.

When the contact angle with the sol-gel liquid on the surface was measured with a micro contact angle meter, in both Example 1 and Comparative Example 1, the SAM film 11 was formed on the Pt layer 3A on the support substrate 10A, and the contact angle with the sol-gel liquid on the Pt layer 3A was 110 degrees and exhibited liquid-repellency.

By contrast, in Example 1, the SAM film 11 was not formed on the amorphous state of the patterned PT-PZT unitary thin film 8A, and the contact angle with the sol-gel liquid was 10 degrees or smaller and exhibited lyophilic property. By contrast, in Comparative Example 1, the SAM film 11 was formed, and the contact angle was 85 degrees and the patterned lead titanate thin film 4A exhibited liquid-repellency.

Figure 8B:
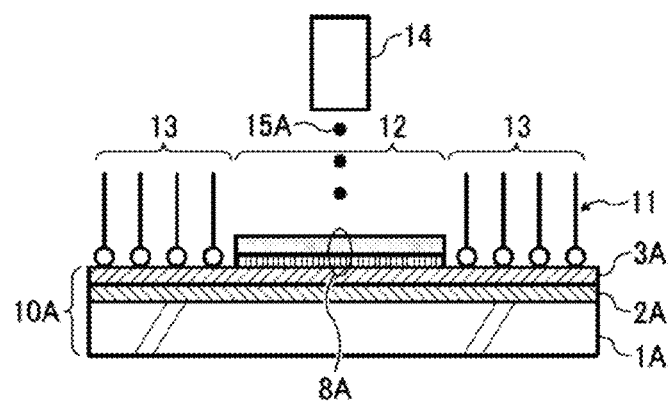
Figure 8C:
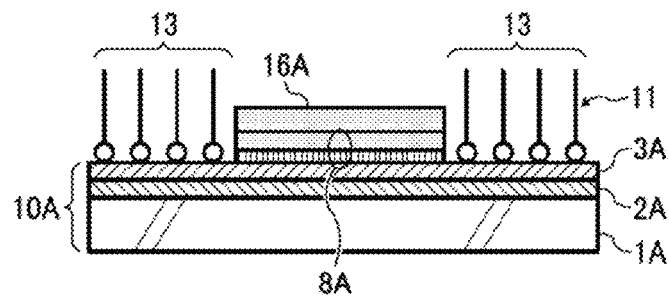

Then, as illustrated in FIG. 8B, the same sol-gel solution 15A of electromechanical transducer film precursor as used in the above-described spin coating was discharged and applied onto an upper face of the patterned PT-PZT unitary thin film 8A by the above-described industrial inkjet application apparatus. Thus, as illustrated in FIG. 8C, a coating film 16A of the precursor of the electromechanical transducer film was formed.

At this time, the sol-gel liquid applied was not spread over the boundary of the electromechanical transducer film pattern which was the amorphous state of the patterned PT-PZT unitary thin film 8A.

Figure 10:
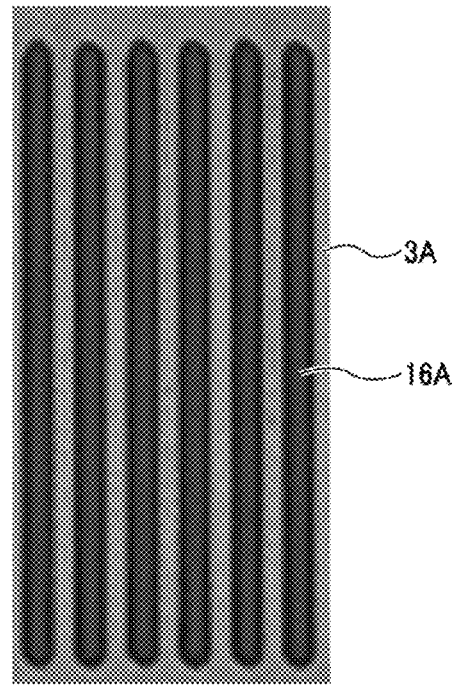
FIG. 10 is an illustration of a state of a coating film in Example 1.

In Example 1, as illustrated in FIG. 10, the sol-gel liquid was uniformly leveled in areas of the amorphous state of the patterned PT-PZT unitary thin film 8A.

Figure 11:
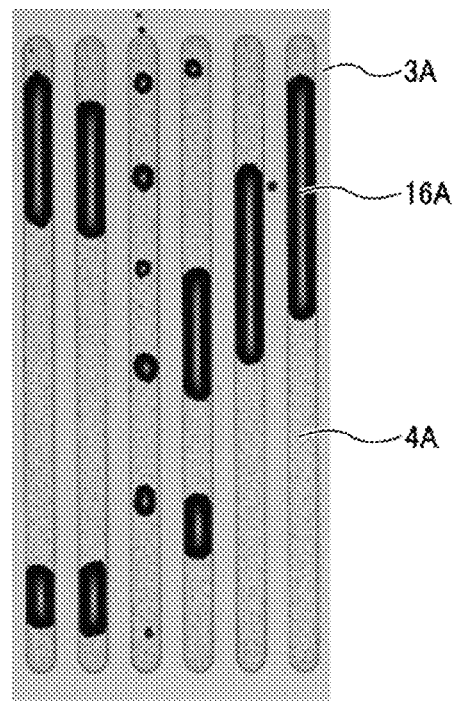
FIG. 11 is an illustration of a state of a coating film in Comparative Example 1.

By contrast, for Comparative Example 1, as illustrated in FIG. 11, the sol-gel liquid was not spread within patterned areas of the amorphous state of the lead titanate thin film 4A, and repelled sol-gel liquid was accumulated at one or several points within the pattern.

In other words, for Comparative Example 1, the film thickness of the patterned lead titanate thin film 4A was quite thin, and the Pt layer 3A was partially exposed on the surface of the lead titanate thin film 4A. Thus, the SAM film 11 was formed on the exposed portion, which exhibited liquid-repellency. As a result, a desired pattern of electromechanical transducer film was not formed.

Next, in Example 1, a heat treatment step was conducted on the sol-gel liquid coating film 16.

First, as a second heating temperature in a drying step, the solvent of the sol-gel liquid was dried at 120° C., which was the same heating temperature as the first heating temperature. Subsequently, an organic substance contained in the sol-gel liquid was thermally decomposed at 500° C. which was a third heating temperature. Another heat treatment step was conducted on the thermally-decomposed electromechanical transducer film to crystallize the thermally-decomposed electromechanical transducer film along with the amorphous state of the patterned unitary thin film 8A already formed. The heat treatment step was conducted by rapid thermal anneal (RTA) at 700° C. which was a fourth heating temperature.

Figure 8D:
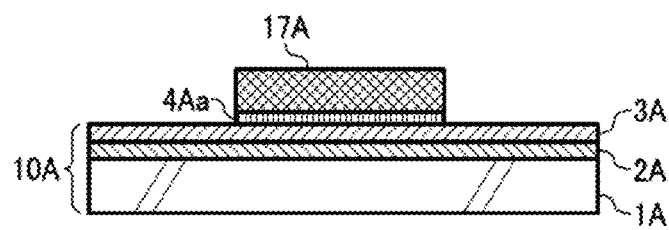

As a result, as illustrated in FIG. 8D, an electromechanical transducer film 17 was obtained in which a ceramic thin film 4A formed as the seed layer, an electromechanical transducer thin film 5A, and an electromechanical transducer film formed by inkjet printing are laminated one on another. At this time, the lead titanate thin film 4A was crystallized to form a lead titanate thin film 4Aa.

At this time, the film thickness of the electromechanical transducer film 17 is 125 nm including the seed layer, and no cracks were formed in the electromechanical transducer film 17. The SAM film 11 was eliminated by the series of heat treatment steps.

Figure 9A:
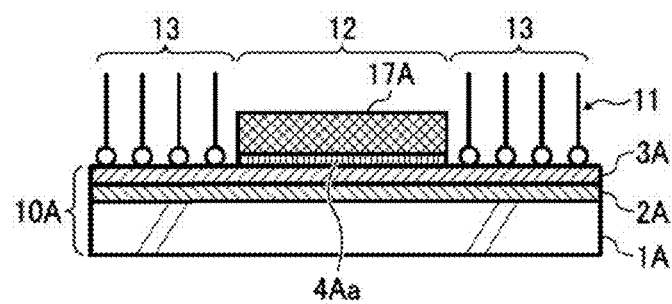
FIGS. 9A through 9D are illustrations of steps subsequent to the steps of FIGS. 8A through 8D.

Subsequently, after the entire surface of the support substrate 10A, on which the electromechanical transducer film 17 obtained as illustrated in FIG. 18D was formed, was washed with isopropyl alcohol, as illustrated in FIG. 9A, the liquid-repellent treatment step to similarly form the SAM film 11 by immersing the support substrate 10A in the alkanethiol solution was conducted.

The SAM film 11 was not formed on the pattern of the electromechanical transducer film 17A which was an oxide film, and accordingly, the SAM film 11 was obtained on only a surface of the Pt layer 3A outside the patterned area and exhibited liquid-repellency again.

Figure 9B:
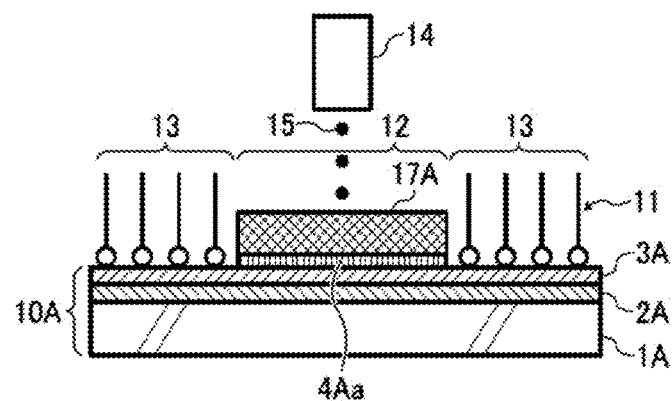
Figure 9C:
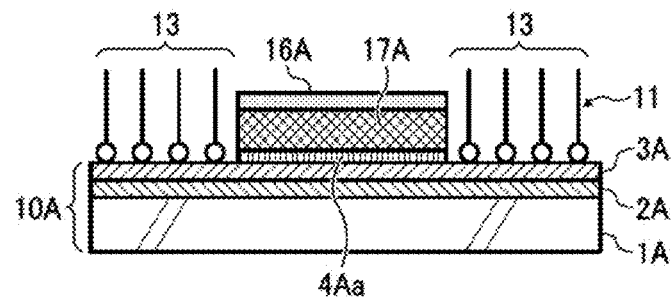
Figure 9D:
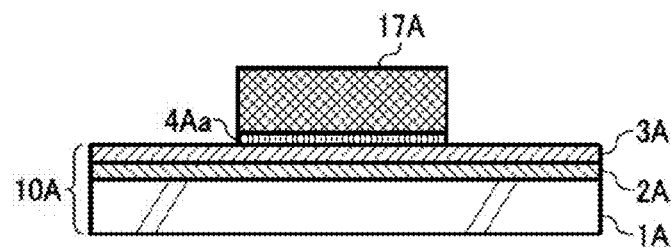

Further, steps illustrated in FIGS. 9B through 9D were repeated to form another layer of an electromechanical transducer film. As a result, an electromechanical transducer film was obtained in which a total film thickness of the electromechanical transducer film 17A was 185 nm. It was found that the electromechanical transducer film 17A obtained did not include cracks and so on.

Then, the steps of FIGS. 9A through 9D were repeated 30 times to form a desired patterned electromechanical transducer film 17A. The film thickness of the electromechanical transducer film 17A obtained was 2.0 μm, and cracks and so on were not found in the electromechanical transducer film 17A.

Example 2

The precursor solution of the ceramic thin film applied onto the entire surface of the support substrate 10A by spin coating in Example 1 was changed to a precursor solution of lead-zirconate-titanate (PZT).

In other words, a solution having the same composition as that of a sol-gel liquid used as a precursor solution of an electromechanical transducer film was used as a precursor solution of a ceramic thin film 4. The concentration of the solid content was prepared to be 0.03 mol/l, which is the same as that of the precursor solution of lead titanate (PT) of Example 1. A pattern of an amorphous state of a PZT-PZT unitary thin film was formed on the support substrate 10A.

The subsequent steps are conducted similarly with those of Example 1. Thus, a desired pattern of the electromechanical transducer film was obtained free of cracks.

Comparative Example 2

After the amorphous state of the PZT-PZT unitary thin film was formed on the entire surface of the support substrate 10, the amorphous state of the PZT-PZT unitary thin film and the support substrate 10 were crystallized by rapid thermal anneal (RTA) at 700° C., which is the fourth heating temperature, before patterning. Then, similarly with the above-described Example 1, patterning was conducted by wet etching.

Figure 12:
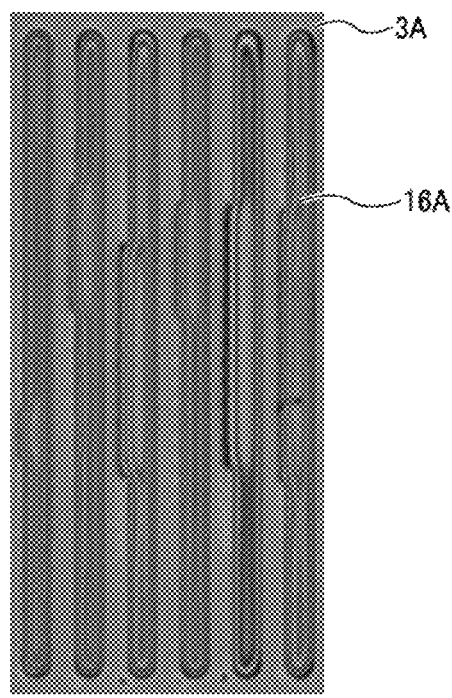
FIG. 12 is an illustration of a state of a coating film in Comparative Example 2.

For Comparative Example 2, as illustrated in FIG. 12, the sol-gel solution of the PZT precursor applied by inkjet method was formed as a coating film to spread to residues of a PZT film formed by wet etching and remaining around an edge line of the pattern of the electromechanical transducer film. In heat treatment after application, the electromechanical transducer film was formed with the shape maintained.

Then, similarly with Examples 1 and 2, the steps of FIGS. 9A through 9D were repeated to obtain the electromechanical transducer film at a film thickness of 2.0 μm.

Figure 13:
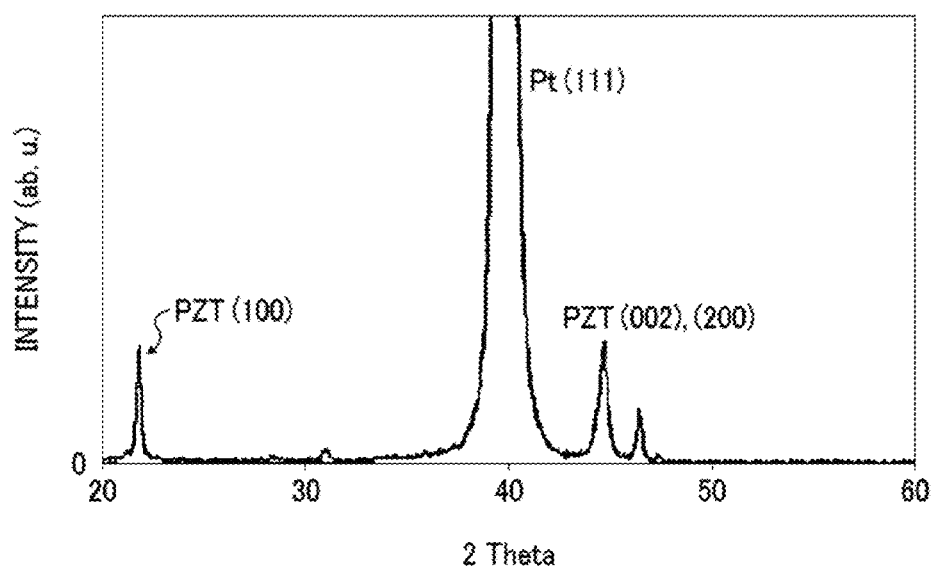
FIG. 13 is a graph showing a measurement result of a crystal structure of an electromechanical transducer film of Example 1.

For the electromechanical transducer films formed as pattern films in Examples 1 and 2 and Comparative Example 2, the crystal structures thereof were measured by an X-ray diffractometer (XRD). Measurement results are shown in FIGS. 13 and 14.

Figures 14, 15:
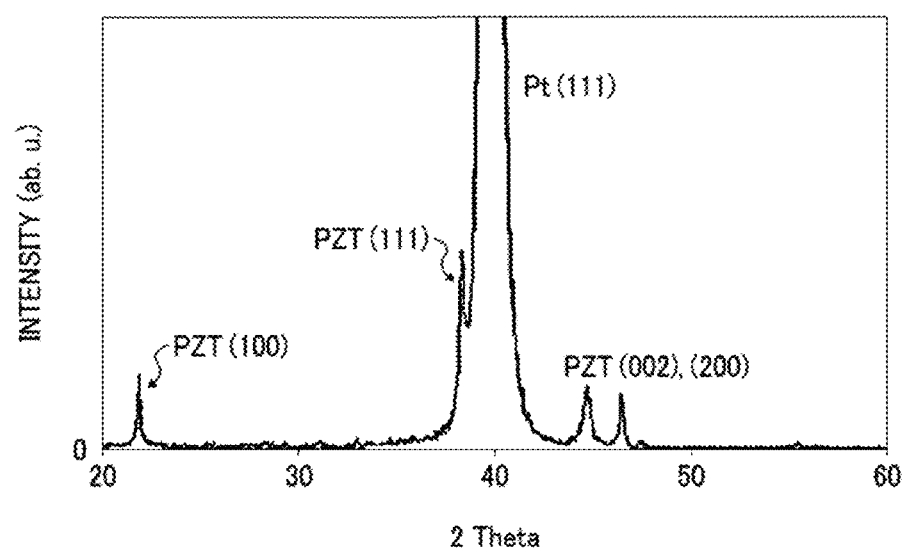
FIG. 14 is a graph showing a measurement result of a crystal structure of an electromechanical transducer film of Example 2.
FIG. 15 is a table showing evaluation results of electric characteristics and an electromechanical transformation capability (a piezoelectric constant) of the electromechanical transducer elements obtained in Examples 1 and 2 and Comparative example 2.

As illustrated in FIG. 15, for the electromechanical transducer films obtained in Examples 1 and 2, the (100) orientation ratio was 99% or higher. In other words, each of the ceramic thin film made of lead titanate in Example 1 and the ceramic thin film made of lead zirconate titanate in Example 2 functions as a seed layer of a (100) oriented electromechanical transducer film crystal.

By contrast, as illustrated in FIG. 14, the electromechanical transducer film obtained in Comparative example 2 was a film in which (100) and (110) orientations are mixed. In other words, the ceramic thin film made of lead zirconate titanate did not function as a seed layer of giving a predetermined orientation in the electromechanical transducer film crystal.

A platinum layer having the film thickness of 250 nm was formed as a second electrode (an upper electrode) on the electromechanical transducer film obtained in each of Examples 1 and 2 and Comparative Example 1. As a result, an electromechanical transducer element was obtained of a lateral vibration (bend mode) type utilizing deformation in the d31 direction.

Electric characteristics and an electromechanical transformation capability (a piezoelectric constant) of the electromechanical transducer element were evaluated. Results are shown in FIG. 15. It was found that the relative dielectric constant, dielectric loss, residual dielectric polarization, and coercive electric field of the film had properties similar to or more excellent properties than those of a normal sintered ceramic body The electromechanical transformation capability was computed by measuring the deformation amount due to the application of electric field using a laser Doppler vibrometer, and matching the measured deformation amount and a simulated model (a simulated result). As a result, the piezoelectric constant d31 was 107 μm/V in the electromechanical transducer element using the electromechanical transducer film of Comparative example 2. By contrast, the piezoelectric constant d31 was 147 μm/V and 151 μm/V in the electromechanical transducer elements using the electromechanical transducer films of Examples 1 and 2, respectively.

In other words, for Examples 1 and 2, high-performance electromechanical transducer films capable of obtaining large deformation amounts can be formed. The deformation amounts were characteristic values that were sufficient for designing the liquid ejection head.

Next, a method of fabricating an electromechanical transducer film according to a second embodiment of the present disclosure is described with reference to FIGS. 16A through 16C, FIGS. 17A through 17C, FIGS. 18A through 18C, and FIGS. 19A and 19B. FIGS. 16A through 16C, FIGS. 17A through 17C, FIGS. 18A through 18C, and FIGS. 19A and 19B are schematic diagrams of the method of fabricating an electromechanical transducer film according to the first embodiment. Note that values, materials, and so on in the fabrication method are not limited to those used in the following descriptions.

Figure 16A:
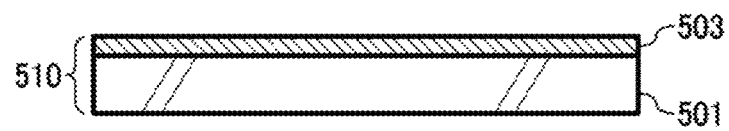
FIGS. 16A through 16C are illustrations of steps in a fabrication method of an electromechanical transducer film according to a second embodiment of this disclosure.

As illustrated in FIG. 16A, a first electrode 503 made of, for example, a platinum layer is formed on one face of a substrate 501 by sputtering to form a support substrate 510.

<Ceramic Thin-Film Forming Step>

Figure 16B:
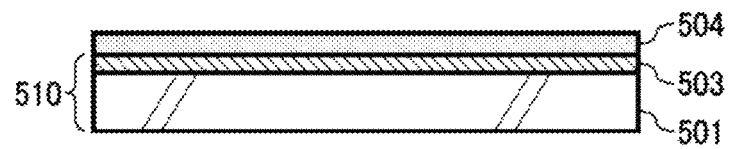

As illustrated in FIG. 16B, a precursor solution of a ceramic thin film is applied onto the entire surface of the first electrode 503 of the support substrate 510 by spin coating, and heated and dried at a first heating temperature which is lower than a crystallization temperature of the precursor solution, to form a precursor thin film 504 serving as an amorphous ceramic thin film.

For example, the precursor thin film 504 having a film thickness of 100 nm is formed by one application, and two steps heating of 120° C. and 250° C. for drying are repeated three times for the precursor thin film 504. Thus, the precursor thin film 504 having a film thickness of 300 nm is formed. Note that the film thickness or the number of applications may be determined depending on values of physical properties, such as viscosity of the precursor solution.

<Patterning Step>

Figure 16C:
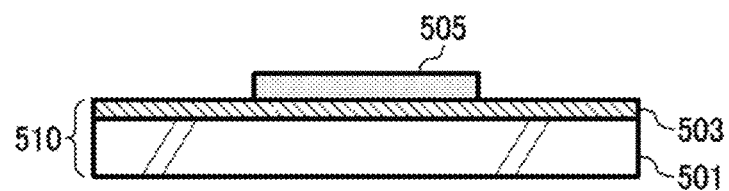

Next, as illustrated in FIG. 16C, the precursor thin film 504 is patterned to form a patterned thin film 505.

<Modifying Step>

Figure 17A:
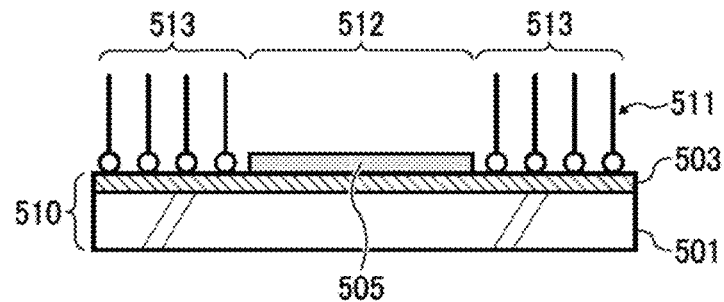
FIGS. 17A through 17C are illustrations of steps subsequent to the steps of FIGS. 16A through 16C.

Next, as illustrated in FIG. 17A, a SAM film 511 is formed on the entire surface of the support substrate 510. The SAM film 511 is obtained by dipping the support substrate 510 into alkanethiol liquid and arranging molecules thereof by themselves. In this embodiment, CH3 (CH2)-SH is used.

Figure 17B:
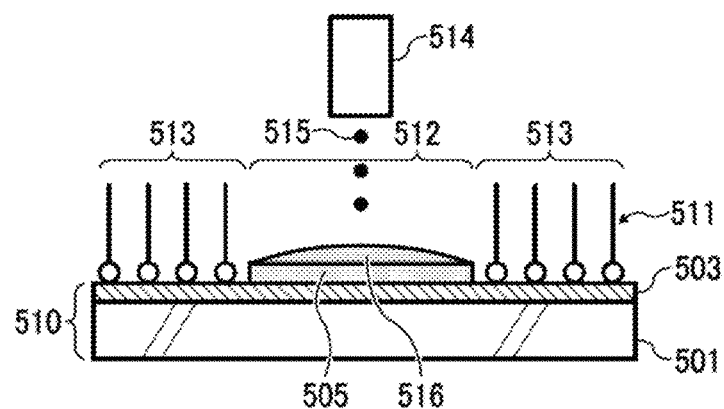

Then, as illustrated in FIG. 17B, a surplus of the SAM film 511 is removed by isopropyl alcohol. The alkanethiol liquid exhibits good adhesiveness on noble metal, and however does not bond oxide. Accordingly, the alkanethiol liquid strongly bonds on platinum forming the first electrode 503, and however, can be readily removed by washing on the patterned thin film 505 made of oxide.

Thus, the contact angle of the SAM film 511 with pure water is 92 degrees and exhibits liquid-repellency, and areas on which the SAM film 511 remains serve as liquid-repellent areas 513. In areas on which the SAM film 511 is removed, the contact angle with pure water is 54 degrees and exhibits lyophilic property. A surface area of the patterned thin film 505 becomes a lyophilic area 512.

<Application Step>

Figure 17C:
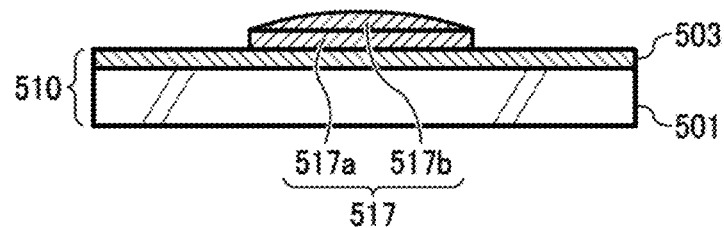

Next, as illustrated in FIG. 17C, a liquid discharge head 514 discharges a PZT precursor solution 515 serving as a precursor solution of a ceramic thin film to form a PZT precursor solution coating film 516 on the patterned thin film 505.

Note that the PZT precursor solution 515 includes lead acetate trihydrate, titanium isopropoxide, and zirconium isopropoxide are used as starting materials. Crystal water of the lead acetate is dissolved in methoxyethanol, and is then dehydrated. A quantity of lead is excessively large by 10 mol % for a stoichiometric composition. The amount of lead acetate added is adjusted as above in order to prevent the degradation of crystallinity due to lead deficiency during the heat treatment.

Titanium isopropoxide and zirconium isopropoxide are dissolved in methoxyethanol to promote an alcohol exchange reaction and an esterification reaction, and the obtained product is mixed with the lead acetate dissolved methoxyethanol to obtain the PZT precursor solution 515. In this example, the PZT concentration is set to 0.1 mol/l.

The film thickness obtained by a single film formation is set to 100 nm. The concentration of the PZT precursor solution 515 is optimized from a relationship of the film formation area and the application amount of the precursor solution.

At this time, as illustrated in FIG. 17C, the PZT precursor solution coating film 516 on the patterned thin film 505 becomes cylindrical due to surface tension. In other words, a cross section of the PZT precursor solution coating film 516 in a direction perpendicular to the surface of the first electrode 503 has a shape in which a middle portion of the PZT precursor solution coating film 516 protrudes further in a direction away from the surface of the first electrode 503 being a reference surface than lateral ends of the PZT precursor solution coating film 516.

Next, as illustrated in FIG. 17C, the PZT precursor solution coating film 516 is heated at 120° C. which is a heating temperature (for solvent drying) lower than a crystallization temperature of the PZT precursor solution coating film 516. Then, thermal decomposition of organic substance is conducted. Thus, a PZT film 517 serving as an electromechanical transducer film is obtained that includes a portion ("tabular portion") 517a corresponding to the patterned thin film 505 and a portion ("cylindrical portion") 517b corresponding to the PZT precursor solution coating film 516. The film thickness of the cylindrical portion 517b of the PZT film 517 is 90 nm.

Figure 18A:
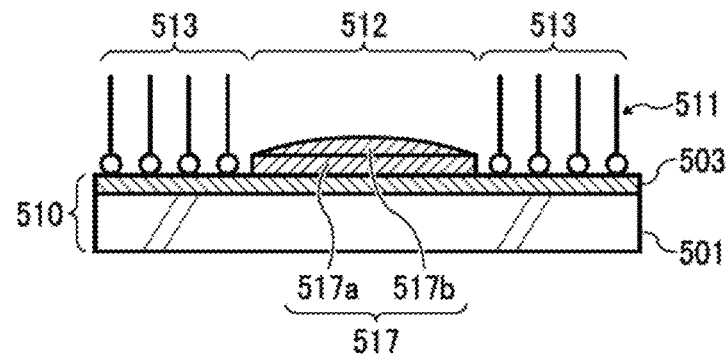
FIGS. 18A through 18C are illustrations of steps subsequent to the steps of FIGS. 17A through 17C.

Next, as illustrated in FIG. 18A, the support substrate 510 is similarly immersed to form a SAM film 511, and washed along with the surface of the PZT film 517 by isopropyl alcohol to form liquid-repellent and lyophilic areas.

Figure 18B:
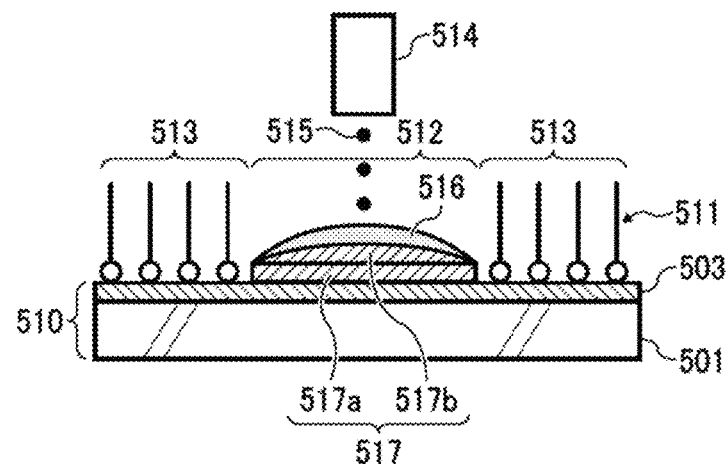

Then, as illustrated in FIG. 18B, registration of the liquid discharge head 514 is conducted on the PZT film 517 having the cylindrical portion 517b previously formed, and the liquid discharge head 514 discharges the PZT precursor solution 515 to form the PZT precursor solution coating film 516.

The PZT precursor solution coating film 516 applied onto the PZT film 517 becomes cylindrical due to surface tension. In other words, a cross section of the PZT precursor solution coating film 516 in a direction perpendicular to the surface of the first electrode 503 has a shape in which a middle portion of the PZT precursor solution coating film 516 protrudes further in a direction away from the surface of the first electrode 503 being a reference surface, than lateral ends of the PZT precursor solution coating film 516.

Figure 18C:
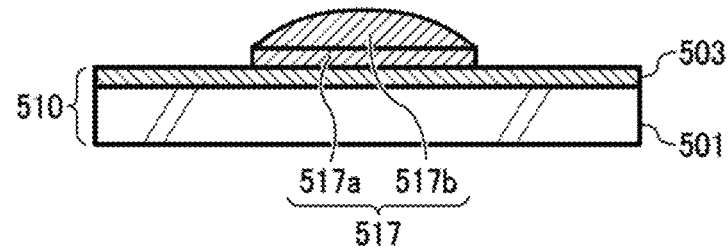

Then, as illustrated in FIG. 18C, the same heating process as described above is conducted to obtain a layered PZT film 517. By repeating the second step, the film thickness of the cylindrical portion 517b of the PZT film 517 becomes, for example, 180 nm.

Below, the steps of FIGS. 18A through 18C are further repeated four times. In other words, in total, the application step of the PZT precursor solution 515 is repeated six times to obtain the PZT film 517 in which the cylindrical portion 517b has a film thickness of 540 nm.

<Crystallization Step>

Figure 19A:
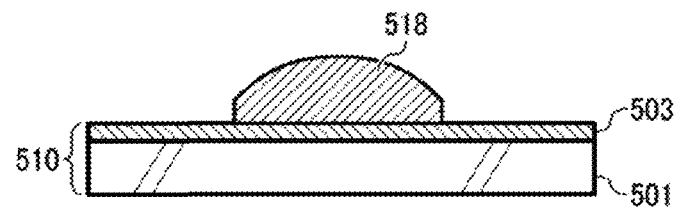
FIGS. 19A and 19B are illustrations of steps subsequent to the steps of FIGS. 18A through 18C.

Then, as illustrated in FIG. 19A, crystallization heat treatment at a heating temperature for crystallization (700° C.) is conducted by RTA (rapid thermal anneal) on the PZT film 517 obtained as described above, thus obtaining a predetermined film thickness of a patterned PZT film 518.

Thus, by combining the film thickness of 300 nm of the tabular portion 517a corresponding to the original patterned thin film 505 having a tabular shape with the film thickness of 540 nm of the cylindrical portion 517b, the patterned PZT film 518 serving as the electromechanical transducer film having a film thickness of 740 nm is obtained. At this time, the patterned PZT film 518 are free of cracks or other failures.

Then, three times of the SAM film treatment, the application step of the PZT precursor solution, drying at 120° C., and thermal decomposition at 500° C. are conducted in this order as the crystallization step. The PZT film is free of cracks or other failures. At this time, the film thickness of the patterned PZT film 518 is 1000 nm.

Figure 19B:
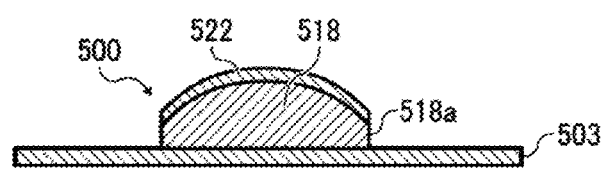

Then, as illustrated in FIG. 19B, a platinum film serving as a second electrode 522 is formed on the patterned PZT film 518 for patterning to form an electromechanical transducer element 500.

Electric characteristics and an electromechanical transformation capability (a piezoelectric constant) of the electromechanical transducer element 500 were evaluated.

Figure 20:
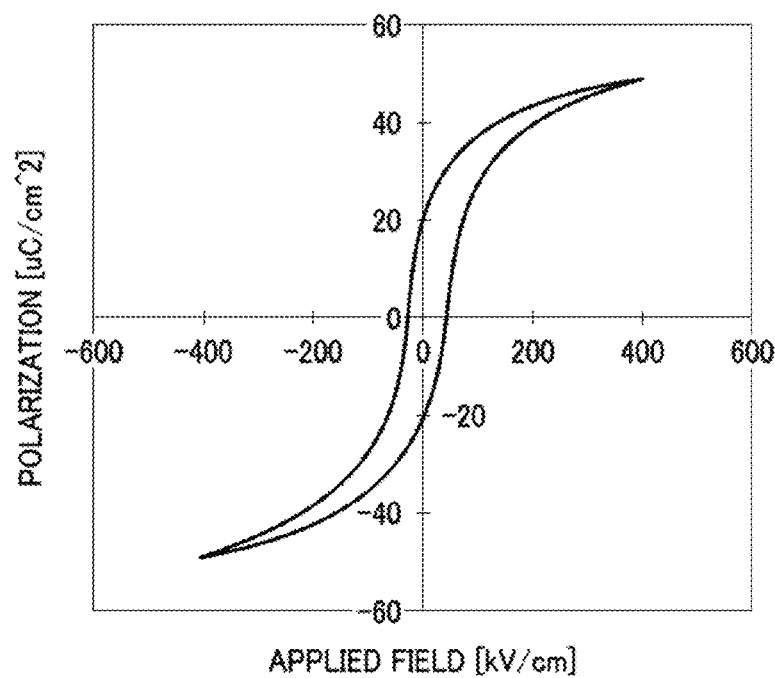
FIG. 20 is a graph showing an example of a P-E hysteresis curve of an electromechanical transducer element obtained in the second embodiment.

For the electromechanical transducer element 500, the relative dielectric constant was 1220, the dielectric loss was 0.02, the residual dielectric polarization was 19.3 $\mu C/cm^2$, and the coercive electric field of the film was 36.5 kV/cm. Therefore, it was found that the electromechanical transducer element 500 had properties similar to or more excellent properties than those of a normal sintered ceramic body. FIG. 20 illustrates a P-E hysteresis curve of the electromechanical transducer element.

Note that the electromechanical transformation capability was computed by measuring the deformation amount due to the application of electric field using a laser Doppler vibrometer, and matching the measured deformation amount and a simulated model (a simulated result). The piezoelectric constant d31 obtained was 120 μm/V. Thus, the obtained value was similar to that of the sintered ceramic body, and a characteristic value sufficient to be used as a pressure generator of a liquid discharge head.

Before forming the above-described second electrode, crystallization treatment is conducted each time of the above-described thermal decomposition annealing repeated six times. The process was repeated ten times to obtain a patterned PZT film having a thickness of 5 μm. At this time, it was confirmed that the patterned PZT film were free of cracks or other failures.

Then, a cross-sectional shape of the patterned PZT film in a short direction thereof was measured with a stylus profilometer. Results are shown in FIG. 21. Note that FIG. 21 shows areas corresponding to two patterned PZT films. In each area, P1 shows a portion corresponding to the cylindrical portion 517b, and P2 shows a portion corresponding to the patterned thin film 505.

For the patterned PZT film 518 according to this embodiment, the patterned thin film 505 is formed by wet etching at both ends in the short direction, both ends have edge faces 518a vertical relative to the surface of the first electrode 503. At a portion thicker than the thickness of the tabular portion 517a corresponding to the patterned thin film 505, the precursor solution is discharged and applied by the liquid discharge head. Accordingly, as described above, the cylindrical portion 517b is formed due to surface tension in drying.

As described above, the electromechanical transducer element 500 according to this embodiment includes the electromechanical transducer film (the patterned PZT film 518) formed on at least a portion of the first electrode 503 and the second electrode 522 formed on at least a portion of the electromechanical transducer film (the patterned PZT film 518). The electromechanical transducer film (the patterned PZT film 518) has a cross-sectional shape in which a middle portion of the electromechanical transducer film (the patterned PZT film 518) protrudes further in a direction away from the surface of the first electrode 503 being a reference surface, than lateral ends of the electromechanical transducer film (the patterned PZT film 518). The lateral ends have edge faces 518a vertical to the surface of the first electrode 503.

FIG. 22 shows an example of a measurement result of dielectric breakdown voltage of the patterned PZT thin film. FIG. 22 also shows a measurement result of dielectric breakdown voltage of a comparative example in which application of the liquid discharge head is conducted without forming the patterned thin film 505.

As seen from FIG. 22, when a PZT thin film is formed without the patterned thin film 505, a vertical, cross-sectional portion is not formed at edge portions and the film thickness of the edge portions are relatively thin, resulting in low dielectric breakdown voltage.

By contrast, as in this embodiment, when the patterned thin film 505 is formed and the edge portions have the vertical edge faces, the patterned PZT thin film exhibits a dielectric strength sufficient as an actuator.

Figure 23:
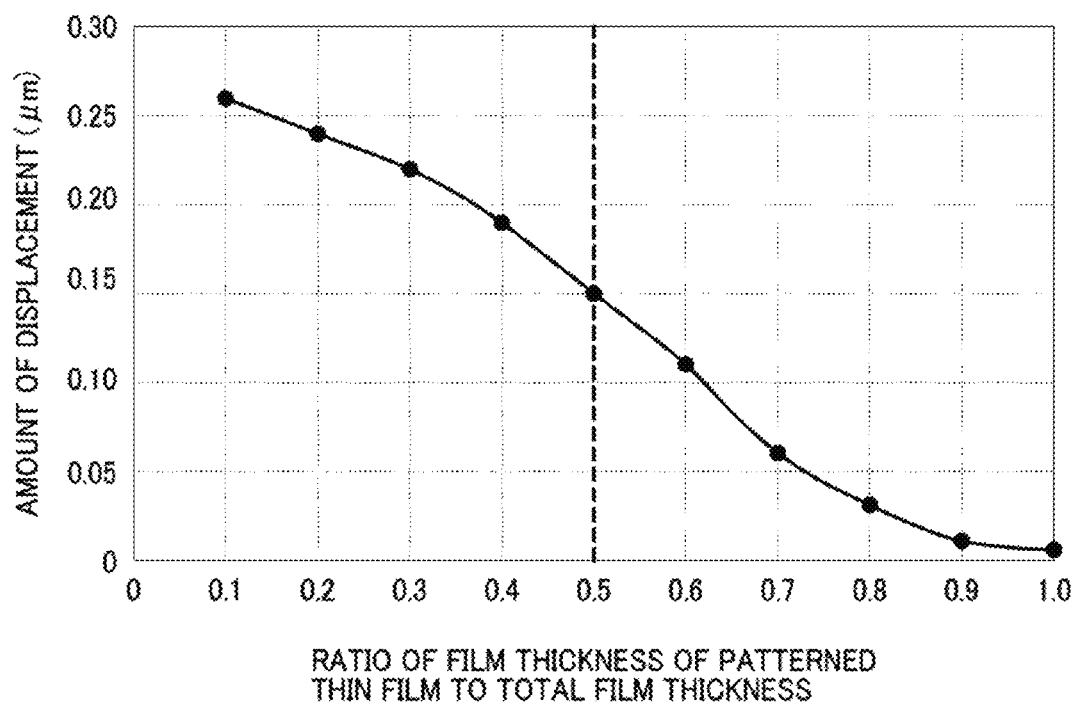
FIG. 23 is a graph showing a relationship between the film thickness of a patterned thin film (tabular portion) and the total film thickness of the electromechanical transducer film.

Next, a relationship between the film thickness of the patterned thin film (tabular portion) and the total film thickness of the electromechanical transducer film is described with reference to FIG. 23. FIG. 23 is a graph illustrating displacement amounts of the electromechanical transducer element for different ratios of the film thickness of the patterned thin film to the film thickness (total film thickness) of the entire electromechanical transducer film.

As seen from FIG. 23, as the ratio of the film thickness of the patterned thin film to the total film thickness increases, the film thickness of end portions of the electromechanical transducer film increases to suppress deformation and decrease the displacement amount.

To obtain a displacement amount (0.15 μm) being a target value of typical actuator performance, it is preferable that the film thickness of the patterned thin film be not greater than half of the total film thickness.

Figure 24:
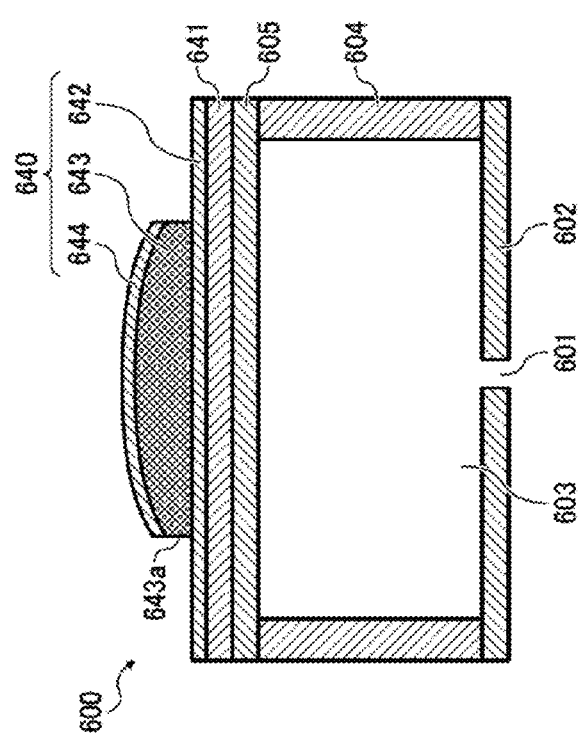
FIG. 24 is a schematic cross-sectional view of a third example of a liquid discharge head according an embodiment of this disclosure.

Next, a third example of a liquid discharge head according to an embodiment of this disclosure is described with reference to FIG. 24. FIG. 24 is a schematic cross-sectional view of a liquid discharge head according to this embodiment.

The liquid discharge head 600 includes a nozzle substrate 602 including nozzles 601 through which to discharge droplets, a channel substrate 604 to form channels (pressure chambers) 603 communicated with the nozzles 601, and a diaphragm 605 forming walls of the pressure chambers 603.

Piezoelectric actuators made of electromechanical transducer elements 640 according to this embodiment are disposed on a face of the diaphragm 605 opposite the pressure chambers 603.

The electromechanical transducer elements 640 includes an oxide electrode 641, a platinum group electrode 642 serving as a first electrode (lower electrode), an electromechanical transducer film 643, a second electrode (upper electrode) 644 that are laminated in this order on the diaphragm 605. The electromechanical transducer elements 640 is formed by a method of fabricating an electromechanical transducer element according to the second embodiment of the present disclosure. Thus, the electromechanical transducer film 643 has a cross-sectional shape in which a middle portion of the electromechanical transducer film 643 protrudes further in a direction away from the surface of the first electrode (the platinum group electrode 642) being a reference surface, than lateral ends of the electromechanical transducer film 643. The lateral ends have edge faces 643a vertical to the surface of the first electrode (the platinum group electrode 642).

For the liquid discharge head 600, by applying a voltage between the upper electrode 644 and the lower electrode 642, the electromechanical transducer film 643 extends in an electrode lamination direction, in other words, an electric-field direction and contracts in a direction parallel to the diaphragm 605.

At this time, since the lower electrode 642 is restricted by the diaphragm 605, a tensile stress arises at a side of the diaphragm 605 facing the lower electrode 642 and the diaphragm 605 bends toward the pressure chamber 603 and pressurizes internal liquid, thus discharging droplets from the nozzles 601.

As described above, use of piezoelectric actuators including the electromechanical transducer elements according to this embodiment allows stable droplet discharge.

Figure 25:
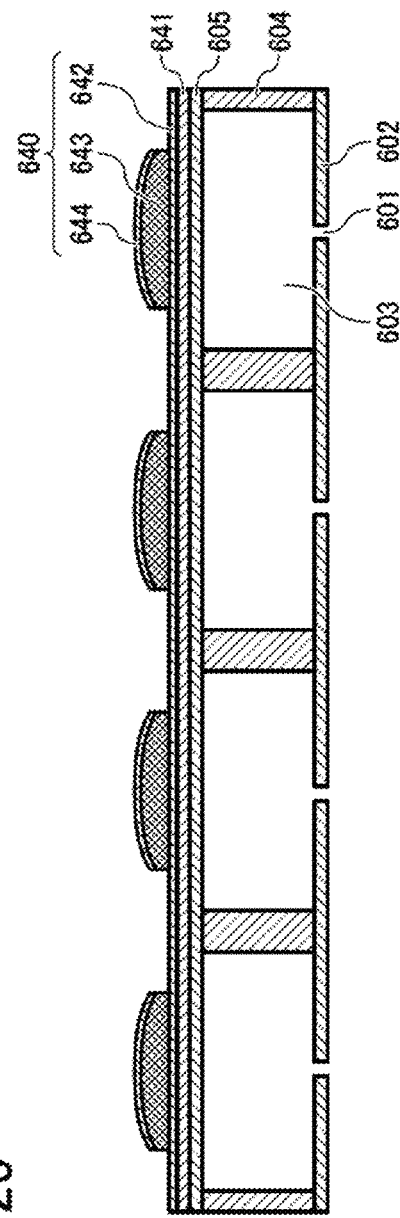
FIG. 25 is a schematic cross-sectional view of a fourth example of a liquid discharge head according an embodiment of this disclosure.

Next, a fourth example of a liquid discharge head according to an embodiment of this disclosure is described with reference to FIG. 25. FIG. 25 is a schematic cross-sectional view of a liquid discharge head 600 according to this embodiment.

The liquid discharge head 600 includes four electromechanical transducer elements 640 sharing a diaphragm 605 and a lower electrode 642 and has a structure of four nozzle rows in which the nozzles 601 are arrayed in four rows. The configuration of a portion corresponding to each nozzle 601 is similar to, if not the same as, that illustrated in FIG. 23, and descriptions thereof are omitted.

Note that, in the above-described first embodiment, by discharging the sol-gel solution with the liquid discharge head, as described in the second embodiment, the electromechanical transducer film 17 also has a cross-sectional shape in which a middle portion protrudes further in a direction away from the surface of the first electrode being a reference surface than lateral ends of the electromechanical transducer film 17, and the lateral ends have edge faces vertical to the surface of the first electrode 3.

Next, an example of an image forming apparatus according to an embodiment of this disclosure is described with reference to FIG. 26. FIG. 26 is a schematic plan view of an image forming apparatus 2000 according to this embodiment.

The image forming apparatus 2000 is a serial-type inkjet recording apparatus. A carriage 403 is supported by a main guide rod 401 and a sub guide rod so as to be movable in a direction (main scanning direction) indicated by arrow D1 in FIG. 13. The main guide rod 401 and the sub guide rod are laterally bridged between left and right side plates. A main scanning motor 405 reciprocally moves the carriage 403 for scanning in the main scanning direction (carriage movement direction) D1 via a timing belt 408 extending between a driving pulley 406 and a driven pulley 407.

The carriage 403 mounts a recording head 404 serving as a liquid discharge head according to an embodiment of this disclosure. The recording head 404 includes, for example, four nozzle rows 404*n* through which to discharge ink droplets of, e.g., yellow (Y), cyan (C), magenta (M), and black (K). The recording head 404 is mounted on the carriage 403 so that the nozzle rows 404*n*, each of which includes multiple nozzles, are arrayed in a sub-scanning direction indicated by arrow D2 perpendicular to the main scanning direction D1 and ink droplets are discharged downward from the nozzles.

To convey a sheet 410, the image forming apparatus 2000 also includes a conveyance belt 412 serving as a conveyor to electrostatically attach the sheet 410 thereon and convey the sheet 410 to a position opposing the recording head 404. The conveyance belt 412 is an endless belt entrained around a conveyance roller 413 and a tension roller 414.

The conveyance roller 413 is rotated by a sub scanning motor 416 via a timing belt 417 and a timing pulley 418, so that the conveyance belt 412 circulates in the sub-scanning direction D2. The conveyance belt 412, while circulating, is charged with a charging roller.

In FIG. 13, the image forming apparatus 2000 further includes a maintenance device (maintenance-and-recovery device) 420 to maintain and recovery the recording heads 404 and a first dummy ejection receptacle 421 to receive droplets discharged during dummy discharge in which droplets not contributing to image formation are discharged from the recording head 404. The maintenance device 420 is disposed at a lateral side of the conveyance belt 412 on one side in the main scanning direction D1 of the carriage 403.

The dummy discharge receptacle 421 is disposed at a lateral side of conveyance belt 412 on the opposite side in the main scanning direction D1.

The maintenance assembly 420 includes, for example, a cap 420*a* to cap a nozzle face of the recording head 404, in which the nozzle rows 404*n* are formed, and a wiper 420*b* to wipe the nozzle face of the recording head 404.

An encoder scale 423 with a predetermined pattern is bridged along the main scanning direction D1 between the side plates, and the carriage 403 mounts an encoder sensor 424 serving as a transmissive photosensor to read the pattern of the encoder scale 423. The encoder scale 423 and the encoder sensor 424 forms a linear encoder (main scanning encoder) to detect movement of the carriage 403.

A code wheel 425 is mounted on a shaft of the conveyance roller 413, and an encoder sensor 426 serving as a transmissive photosensor is disposed to detect a pattern of the code wheel 425. The code wheel 425 and encoder sensor 426 forms a rotary encoder (sub-scanning encoder) to detect the movement amount and position of conveyance belt 412.

In the image forming apparatus 2000 thus configured, a sheet 410 is fed from a sheet feed tray onto the conveyance belt 412 charged with the charging roller. With the sheet 410 attracted on the conveyance belt 412, the conveyance belt 412 is circulated to convey the sheet 410 in the sub-scanning direction D2.

By driving the recording head 404 in accordance with image signals while moving the carriage 403, ink droplets are discharged onto the sheet 410, which is stopped below the recording head 404, to form one line of a desired image. Then, the sheet 410 is fed by a predetermined distance to prepare for the next operation to record another line of the image. Receiving a recording end signal or a signal indicating that the rear end of the sheet 410 has arrived at a recording area, the recording operation finishes and the sheet 410 is output to an ejection tray.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A method of fabricating an electromechanical transducer film, the method comprising:
    applying a precursor solution of a ceramic thin film on a surface of a support substrate;
    heating and drying the support substrate at a first heating temperature lower than a decomposition temperature of the precursor solution in a range of 350° to 500°, to form the ceramic thin film in an amorphous state;
    applying a sol-gel solution of a precursor of the electromechanical transducer film onto the ceramic thin film;
    heating and drying the ceramic thin film and the sol-gel solution at a second heating temperature lower than the decomposition temperature of each of the ceramic thin film and the precursor solution in the range of 350° to 500°, to form an electromechanical transducer thin film in an amorphous state;
    heating the ceramic thin film and the electromechanical transducer thin film at a third heating temperature higher than each of the first heating temperature and the second heating temperature to thermally decompose an organic substance in the sol-gel solution, at the decomposition temperature in the range of 350° to 500°, and form a unitary thin film, wherein in a state before the heating at the third heating temperature, the ceramic thin film and the electromechanical transducer thin film are kept in an amorphous state;

processing the unitary thin film in a desired pattern to form a patterned unitary thin film;

modifying an area of the surface of the support substrate on which the patterned unitary thin film is not formed;

discharging the sol-gel solution onto a surface of the patterned unitary thin film by a liquid discharge head to apply the sol-gel solution to the surface of the patterned unitary thin film; and heating the patterned unitary thin film, on which the sol-gel solution is applied, at a fourth heating temperature higher than the third heating temperature to crystallize the patterned unitary thin film.

2. The method according to claim 1, wherein at least a portion of metal elements contained in the electromechanical transducer thin film in the amorphous state is common to metal elements contained in the ceramic thin film.

3. The method according to claim 1, wherein the patterned unitary thin film is amorphous.

4. A method of fabricating an electromechanical transducer element, the method comprising:

forming the electromechanical transducer film on a first electrode by the method according to claim 1; and forming a second electrode on the electromechanical transducer film to form the electromechanical transducer element.

5. A method of fabricating an electromechanical transducer element comprising a first electrode, an electromechanical transducer film disposed on at least a portion of the first electrode, and a second electrode disposed on at least a portion of the electromechanical transducer film, the electromechanical transducer film having a cross-sectional shape in which a middle portion thereof protrudes further in a direction away from a surface of the first electrode than lateral ends thereof, the lateral ends having edge faces vertical to the surface of the first electrode, the method comprising:

performing the method as claimed in claim 1, to form the electromechanical transducer film at a predetermined film thickness; and providing the second electrode on the electromechanical transducer film having the predetermined film thickness.

6. The method according to claim 1, wherein a film thickness of the ceramic thin film is in a range of one-twentieth to one-tenth of a film thickness of the electromechanical transducer thin film.

* * * * *